(12) United States Patent
Hashimoto et al.

(10) Patent No.: US 10,522,793 B2
(45) Date of Patent: Dec. 31, 2019

(54) MULTILAYER FILM, MANUFACTURING METHOD, CIRCULAR-POLARIZING PLATE, ANTIREFLECTIVE FILM, AND ORGANIC ELECTROLUMINESCENCE DISPLAY DEVICE

(71) Applicant: ZEON CORPORATION, Chiyoda-ku, Tokyo (JP)

(72) Inventors: Hiromasa Hashimoto, Tokyo (JP); Masaru Kikukawa, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 85 days.

(21) Appl. No.: 15/776,575

(22) PCT Filed: Nov. 14, 2016

(86) PCT No.: PCT/JP2016/083718
§ 371 (c)(1),
(2) Date: May 16, 2018

(87) PCT Pub. No.: WO2017/094485
PCT Pub. Date: Jun. 8, 2017

(65) Prior Publication Data
US 2018/0375065 A1    Dec. 27, 2018

(30) Foreign Application Priority Data

Nov. 30, 2015  (JP) .................................. 2015-233317

(51) Int. Cl.
*H01L 51/52*       (2006.01)
*B32B 7/12*        (2006.01)
(Continued)

(52) U.S. Cl.
CPC ............. *H01L 51/5281* (2013.01); *B32B 7/12* (2013.01); *B32B 27/08* (2013.01); *G02B 1/111* (2013.01);
(Continued)

(58) Field of Classification Search
CPC .... G02B 5/3025; G02B 5/3083; G02B 1/111; H01L 51/5253; H01L 51/5281; H01L 51/5293; B32B 7/12
(Continued)

(56) References Cited

U.S. PATENT DOCUMENTS 5,194,534 A      3/1993 Bell
10,338,291 B2 *  7/2019 Sudeji ................ B29C 48/9135
(Continued)

FOREIGN PATENT DOCUMENTS

EP    1508823 A1    2/2005
JP    H05100114 A   4/1993
(Continued)

OTHER PUBLICATIONS

Feb. 14, 2017, International Search Report issued in the International Patent Application No. PCT/JP2016/083718.
(Continued)

*Primary Examiner* — Ricky D Shafer
(74) *Attorney, Agent, or Firm* — Kenja IP Law PC

(57) ABSTRACT

A multilayer film for an organic electroluminescent display device, the multilayer film including: a phase difference film; and a barrier layer directly disposed on a surface of the phase difference film, wherein the phase difference film includes one or more layers of a resin A as a layer in direct contact with the barrier layer, the resin A includes a crystallizable polymer A having a melting point of 250° C. or higher, and the layer of the resin A has a specific value of in-plane retardation Re measured with light having a wave-
(Continued)

length of 590 nm at 23° C., and an absolute value of a photoelastic coefficient of $2.0 \times 10^{-11}$ $Pa^{-1}$ or less; a production method therefor; and use thereof.

12 Claims, 3 Drawing Sheets

(51) Int. Cl.
  *B32B 27/08* (2006.01)
  *G02B 1/111* (2015.01)
  *G02B 5/30* (2006.01)
(52) U.S. Cl.
  CPC .......... *G02B 5/305* (2013.01); *H01L 51/5253* (2013.01); *H01L 51/5275* (2013.01); *H01L 51/5293* (2013.01); *B32B 2457/206* (2013.01)
(58) Field of Classification Search
  USPC .................. 359/487.02, 487.07, 900
  See application file for complete search history.

(56) References Cited

U.S. PATENT DOCUMENTS

| | | | |
|---|---|---|---|
| 2003/0067574 A1 | 4/2003 | Sasaki et al. | |
| 2004/0212767 A1 | 10/2004 | Sasaki et al. | |
| 2005/0249890 A1 | 11/2005 | Murakami et al. | |
| 2006/0134400 A1* | 6/2006 | Takada .................. | C08G 18/672 428/313.9 |
| 2008/0118668 A1* | 5/2008 | Sasata ..................... | C08J 5/18 428/1.1 |
| 2008/0252827 A1* | 10/2008 | Hirai ..................... | B32B 7/12 349/96 |
| 2011/0224342 A1 | 9/2011 | Masuda et al. | |
| 2012/0018685 A1* | 1/2012 | Sasada ................... | C08J 5/18 252/585 |
| 2018/0081224 A1* | 3/2018 | Kamo ................ | G02F 1/13363 |
| 2019/0064413 A1* | 2/2019 | Kobayashi ............... | G02B 5/30 |
| 2019/0255757 A1* | 8/2019 | Kikukawa ............... | B29C 55/08 |

FOREIGN PATENT DOCUMENTS

| | | |
|---|---|---|
| JP | H05345817 A | 12/1993 |
| JP | H1068816 A | 3/1998 |
| JP | H11183723 A | 7/1999 |
| JP | H11295526 A | 10/1999 |
| JP | 2002194067 A | 7/2002 |
| JP | 2003114325 A | 4/2003 |
| JP | 2009190186 A | 8/2009 |
| JP | 2010181561 A | 8/2010 |
| JP | 4708787 B2 | 6/2011 |
| JP | 2011118137 A | 6/2011 |
| JP | 2011201043 A | 10/2011 |
| JP | 2011231269 A | 11/2011 |
| JP | 2012025167 A | 2/2012 |
| JP | 2012099392 A | 5/2012 |

OTHER PUBLICATIONS

Jun. 5, 2018, International Preliminary Report on Patentability issued in the International Patent Application No. PCT/JP2016/083718.

* cited by examiner

MULTILAYER FILM, MANUFACTURING METHOD, CIRCULAR-POLARIZING PLATE, ANTIREFLECTIVE FILM, AND ORGANIC ELECTROLUMINESCENCE DISPLAY DEVICE

FIELD

The present invention relates to a multilayer film, a production method, a circularly polarizing plate, an antireflective film, and an organic electroluminescent display device.

BACKGROUND

In an organic electroluminescent display device, a component for protecting the light-emitting layer and layers around the light-emitting layer is usually provided in order to prevent the deterioration thereof. For example, it is known that when an organic electroluminescent display device includes a substrate plate and a light-emitting layer formed thereon, a sealing material layer is disposed on the light-emitting layer, and a barrier layer for interfering with the transmission of moisture, oxygen, and the like is further disposed thereon.

As such a barrier layer, a barrier layer having a multilayer structure with a substrate for forming the barrier layer is known. That is, a barrier layered body containing a substrate and a barrier layer disposed on this substrate is prepared, and then the prepared barrier layered body is incorporated into an organic electroluminescent display device. A glass substrate has often been used as the substrate of the barrier layered body. However, it is recently proposed to use a substrate film made of a resin as the substrate (see Patent Literatures 1 to 3).

Furthermore, an organic electroluminescent display device may be provided with a circularly polarizing plate in order to reduce the reflection of outside light on the display surface. As such a circularly polarizing plate, a film including a combination of a linear polarizer and a ¼ wave plate as a phase difference film is generally used. As this ¼ wave plate, a broadband ¼ wave plate including a combination of a ¼ wave plate and a ½ wave plate has been proposed (see Patent Literatures 4 to 9). According to this broadband ¼ wave plate, retardation of an approximately quarter wavelength can be attained with light in an ideally wide wavelength range. Therefore, a circularly polarizing plate that can reduce reflection of outside light in a wide wavelength range can be achieved. In addition, there is known a technology of a phase difference film in which the slow axis direction exists in an oblique direction which is neither orthogonal nor parallel to the width direction of the film among the in-plane directions of the film, as disclosed in Patent Literature 10.

CITATION LIST

Patent Literature

Patent Literature 1: Japanese Patent Application Laid-Open No. 2011-201043 A
Patent Literature 2: Japanese Patent Application Laid-Open No. 2009-190186 A
Patent Literature 3: Japanese Patent Application Laid-Open No. 2011-231269 A
Patent Literature 4: Japanese Patent No. 4708787 B (corresponding foreign publication: European Patent Application Publication No. 1508823)
Patent Literature 5: Japanese Patent Application Laid-Open No. Hei. 05-100114 A
Patent Literature 6: Japanese Patent Application Laid-Open No. 2003-114325 A (corresponding foreign publication: U.S. Patent Application Publication No. 2003/067574)
Patent Literature 7: Japanese Patent Application Laid-Open No. Hei. 10-68816 A
Patent Literature 8: Japanese Patent Application Laid-Open No. Hei. 11-183723 A
Patent Literature 9: Japanese Patent Application Laid-Open No. Hei. 11-295526 A
Patent Literature 10: Japanese Patent Application Laid-Open No. 2012-25167 A

SUMMARY

Technical Problem

By using a substrate film made of a resin as a substrate of a barrier layered body in place of a glass substrate, a lightweight, thin organic electroluminescent display device having a large display surface can be obtained. However, there is a demand for further weight reduction and thickness reduction of the organic electroluminescent display device. In addition, when configuring an organic electroluminescent display device having a curved display surface instead of a known planar display surface, components of such a device are required to have flexibility and not to impair optical properties even when used on the curved surface.

As a strategy for meeting such requirements, it is conceivable that a barrier layer is unified with another layer that is provided to an organic electroluminescent display device. That is, it is conceivable that a film that has hitherto been provided to an organic electroluminescent display device for another purpose is used in place of a substrate film that has hitherto been used for forming a barrier layer, so that a layered structure having a function equivalent to that in prior art is obtained with fewer components. For example, it is conceivable to use a multilayer film which includes a barrier layer, and a phase difference film that is provided to an organic electroluminescent display device for a purpose such as antireflection.

However, when such a multilayer film is formed, a phase difference film is likely to be deformed due to conditions such as a temperature during the formation of a barrier layer. As a result, there has been sometimes caused problems such as deformation including wrinkles and rippling on the film surface, curling of the film, insufficient adhesion between the barrier layer and the phase difference film, and insufficient optical properties of the phase difference film.

Therefore, an object of the present invention is to provide: a multilayer film, a circularly polarizing plate, and an antireflective film, which are useful as a component of a thin organic electroluminescent display device, do not cause failures such as surface deformation and curling, have favorable adhesion between a barrier layer and a phase difference film, and can favorably exhibit optical properties; and a method for producing the multilayer film.

Solution to Problem

The present inventor conducted research for solving the aforementioned problems. As a result, the present inventor has found that the problems can be solved by adopting a specific material as a material constituting the phase difference film. Thus, the present invention has been completed.

That is, the present invention is as follows.

(1) A multilayer film for an organic electroluminescent display device, the multilayer film comprising: a phase difference film; and a barrier layer directly disposed on a surface of the phase difference film, wherein the phase difference film includes one or more layers of a resin A as a layer in direct contact with the barrier layer, the resin A includes a crystallizable polymer A having a melting point of 250° C. or higher, and the layer of the resin A has an in-plane retardation Re of 108 nm or more and 168 or less measured with light having a wavelength of 590 nm at 23° C., and an absolute value of a photoelastic coefficient of $2.0 \times 10^{-11}$ $Pa^{-1}$ or less.

(2) The multilayer film according to (1), wherein the polymer A is an alicyclic structure-containing polymer having a positive intrinsic birefringence value, and an absolute value of a thermal size change ratio in a plane of a film when the layer of the resin A is heated at 150° C. for 1 hour is 1% or less.

(3) The multilayer film according to (1) or (2), wherein the layer of the resin A has a birefringence Δn of 0.0010 or more.

(4) The multilayer film according to any one of (1) to (3), wherein the multilayer film has a long-length shape, the phase difference film includes a ¼ wave plate as the layer of the resin A, the phase difference film further includes a ½ wave plate, a slow axis of the ½ wave plate and a slow axis of the ¼ wave plate are each in an oblique direction relative to a long-length direction of the multilayer film, and an angle of intersection between the slow axis of the ½ wave plate and the slow axis of the ¼ wave plate is 55° or larger and 65° or smaller.

(5) The multilayer film according to (4), wherein a thickness dh of the ½ wave plate and a thickness dq of the ¼ wave plate are each 10 μm or more and 50 μm or less and satisfy a relation of dh dq.

(6) The multilayer film according to (4) or (5), wherein the ½ wave plate and the ¼ wave plate are each a stretched film having been subjected to oblique stretching one or more times.

(7) The multilayer film according to any one of (1) to (6), having a water vapor permeability of 0.01 g/(m²·day) or lower.

(8) The multilayer film according to any one of (1) to (7), wherein the barrier layer includes one or more inorganic barrier layers.

(9) A method for producing the multilayer film according to any one of (4) to (8), comprising a step of bonding the ½ wave plate and the ¼ wave plate via an adhesive to form a phase difference film including these wave plates; and a step of forming the barrier layer directly on a surface of the phase difference film on a side of the ¼ wave plate.

(10) A circularly polarizing plate comprising:

the multilayer film according to any one of (1) to (8); and a linear polarizer disposed on a surface of the multilayer film opposite to the barrier layer.

(11) An antireflective film comprising the circularly polarizing plate according to (10), wherein the antireflective film includes the linear polarizer, the ½ wave plate, the ¼ wave plate as the layer of the resin A, and the barrier layer in this order, an angle formed between a polarizing transmission axis of the linear polarizer and a slow axis of the ½ wave plate is 10° or more and 20° or less, or 70° or more and 80° or less, and a ratio $R_0/R_{10(0\ deg)}$ of a reflectivity $R_0$ at an incident angle of 0° relative to a reflectivity $R_{10(0\ deg)}$ at an incident angle of 10° at an azimuth angle of 0°, and a ratio $R_0/R_{10(180\ deg)}$ of the reflectivity $R_0$ at the incident angle of 0° relative to a reflectivity $R_{10(180\ deg)}$ at an incident angle of 10° at an azimuth angle of 180° are both 0.95 or more and 1.05 or less.

(12) An organic electroluminescent display device comprising the antireflective film according to (11).

Advantageous Effects of Invention

The multilayer film, circularly polarizing plate, and antireflective film according to the present invention are useful as a component of a thin organic electroluminescent display device, do not cause failures such as surface deformation and curling, have favorable adhesion between the barrier layer and the phase difference film, and can exhibit favorable barrier properties and optical properties, as well as can exhibit the antireflection function in which a difference in reflectivity due to a difference in the incident angle is minor. As a result, the multilayer film, circularly polarizing plate, and antireflective film according to the present invention can be usefully employed in a display device having a curved display surface.

DESCRIPTION OF EMBODIMENTS

Figure 1:
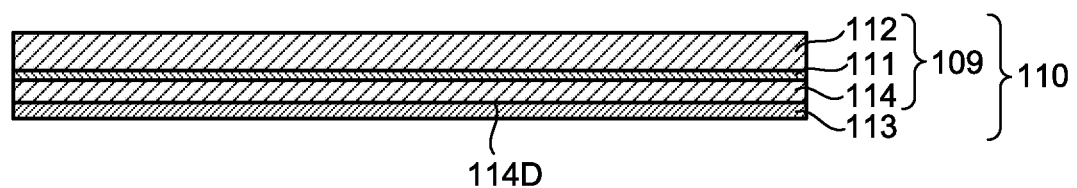
FIG. 1 is a cross-sectional view schematically illustrating an example of a multilayer film according to the present invention.

Hereinafter, the present invention will be described in detail with reference to embodiments and examples. However, the present invention is not limited to the following embodiments and examples, and may be freely modified and practiced without departing from the scope of claims of the present invention and the scope of their equivalents.

Unless otherwise specified in the following description, an in-plane retardation Re of a film refers to a value represented by Re=(nx−ny)×d, and a birefringence Δn of a film refers to a value represented by "Δn=nx−ny". Herein, nx represents a refractive index in a direction which, among directions perpendicular to the thickness direction of the film (in-plane directions), gives the maximum refractive index. ny represents a refractive index in a direction which is orthogonal to the direction of nx among the aforementioned in-plane directions. nz represents a refractive index in the thickness direction. d represents the thickness of the film. The measuring wavelength is 590 nm unless otherwise specified.

In the following description, a front direction relative to a certain surface means a normal direction of the surface, unless otherwise specified. Specifically, a front direction means a direction of 0° polar angle and 0° azimuth angle relative to the surface.

In the following description, a direction of an element being "parallel", "perpendicular", and "orthogonal" may allow an error within the range of not impairing the advantageous effects of the present invention, for example, within a range of ±5°, preferably ±3°, and more preferably ±1°, unless otherwise specified.

In the following description, "polarizing plate", "¼ wave plate", and "½ wave plate" include not only a rigid member, but also a flexible member, such as, for example, a resin film, unless otherwise specified.

In the following description, an angle formed between optical axes (absorption axis, slow axis, and the like) of respective layers in a member provided with a plurality of layers represents an angle when viewed in a thickness direction of the film, unless otherwise specified.

In the following description, a slow axis of a film represents a slow axis within a plane of the film, unless otherwise specified.

In the following description, an "orientation angle" of a long-length film refers to an angle formed by a slow axis of the film relative to the width direction of the film, unless otherwise specified.

In the following description, a "long-length" film means a film having a length that is 5 or more times the width, and preferably a film having a length that is 10 or more times the width, and specifically means a film having a length that allows a film to be wound up into a roll shape and stored or transported. The upper limit of the length of the long-length film is not particularly limited, but may be 100,000 or less times the width.

1. Summary of Multilayer Film

The multilayer film according to the present invention comprises a phase difference film, and a barrier layer directly disposed on a surface of the phase difference film.

FIG. 1 is a cross-sectional view schematically illustrating an example of the multilayer film according to the present invention. In FIG. 1, the multilayer film 110 includes a phase difference film 109, and a barrier layer 113 directly disposed on the surface 114D of the phase difference film 109. In this example, the phase difference film 109 includes a ¼ wave plate 114 serving as a layer of a resin A, a ½ wave plate 112 serving as an optional layer, and an adhesive layer 111 interposed therebetween.

2. Layer of Resin A

The phase difference film includes one or more layers of a resin A.

In the phase difference film, the layer of the resin A is a layer to be in direct contact with the barrier layer. That is, the surface of the phase difference film to be in contact with the barrier layer is constituted by a resin A. Specifically, when the phase difference film is constituted of one layer alone, the layer is a layer of the resin A. When the phase difference film is constituted of two or more layers, the layer on the side in contact with the barrier layer among those layers is the layer of the resin A. When the phase difference film is constituted of two or more layers, each of the one or more layers other than the layer constituting the surface on the side in contact with the barrier layer may be the layer of the resin A or a resin layer other than the resin A.

The resin A contains a crystallizable polymer A having a specific melting point.

That the polymer A is "crystallizable" means that the polymer A is a polymer having a melting point that can be observed using a differential scanning calorimeter (DSC). When a crystallizable polymer is used as the polymer A, the denaturation of a phase difference film during the formation of the barrier layer can be reduced. As a result, a multilayer film that does not cause failures such as surface deformation and curling, has favorable adhesion between a barrier layer and a phase difference film, and can favorably exhibit optical properties can be obtained. If a polymer does not show a melting point that can be observed by differential scanning calorimeter (DSC), the polymer is referred to as "amorphous".

Examples of the crystallizable polymer may include a crystallizable alicyclic structure-containing polymer, and a crystallizable polystyrene-based polymer (see Japanese Patent Application Laid-Open No. 2011-118137 A). Among these, a crystallizable alicyclic structure-containing polymer is preferable because of excellent transparency, low hygroscopicity, size stability, and light weight properties.

The alicyclic structure-containing polymer refers to a polymer having an alicyclic structure in its molecule, the polymer being obtainable by performing a polymerization reaction using a cyclic olefin as a monomer, or a hydrogenated product thereof. Examples of the alicyclic structure contained in the alicyclic structure-containing polymer may include a cycloalkane structure and a cycloalkene structure. Among these, a cycloalkane structure is preferable because the layer of the resin A having excellent properties such as heat stability can be easily obtained. The number of carbon atoms contained in one alicyclic structure is preferably 4 or more, and more preferably 5 or more, and is preferably 30 or less, more preferably 20 or less, and particularly preferably 15 or less. When the number of carbon atoms contained in one alicyclic structure falls within the aforementioned ranges, the mechanical strength, heat resistance, and moldability are highly balanced.

In the alicyclic structure-containing polymer, the ratio of the structural unit having the alicyclic structure relative to all structural units is preferably 30% by weight or more, more preferably 50% by weight or more, and particularly preferably 70% by weight or more. When the ratio of the structural unit having the alicyclic structure in the alicyclic structure-containing polymer is made large as described above, heat resistance can be improved.

In the alicyclic structure-containing polymer, the remainder other than the structural unit having the alicyclic structure is not particularly limited, and may be appropriately selected depending on its purpose of use.

The melting point Tm of the polymer A such as the crystallizable alicyclic structure-containing polymer is 250° C. or higher, preferably 255° C. or higher, and more preferably 260° C. or higher, and is preferably 290° C. or lower. When the polymer A having such a melting point Tm is used, the layer of the resin A can have an excellent balance of moldability and heat resistance.

The weight-average molecular weight (Mw) of the polymer A is preferably 1,000 or more, and more preferably 2,000 or more, and is preferably 1,000,000 or less, and more preferably 500,000 or less. The polymer A having such a weight-average molecular weight has an excellent balance of molding processability and heat resistance. In particular, when the polymer A is a crystallizable alicyclic structure-containing polymer, this tendency is prominent.

The molecular weight distribution (Mw/Mn) of the polymer A is preferably 1.0 or more, and more preferably 1.5 or more, and is preferably 4.0 or less, and more preferably 3.5 or less. Here, Mn represents a number-average molecular weight. The polymer A having such a molecular weight distribution is excellent in molding processability. In particular, when the polymer A is a crystallizable alicyclic structure-containing polymer, this tendency is prominent.

The weight-average molecular weight (Mw) and the molecular weight distribution (Mw/Mn) of the polymer A may be measured as a polystyrene-equivalent value by gel permeation chromatograph (GPC) using tetrahydrofuran as a development solvent.

The glass transition temperature Tg of the polymer A is not particularly limited, but is usually 85° C. or higher and is usually 170° C. or lower.

When a crystallizable alicyclic structure-containing polymer is adopted as the polymer A, specific examples of the polymer may include the following polymer (α) to polymer (δ). Of these, the polymer (β) is preferable as the polymer, because a layer of the resin A having excellent heat resistance can therewith be easily obtained:

Polymer (α): ring-opening polymer of a cyclic olefin monomer, having crystallizability Polymer (β): hydrogenated product of polymer (α), having crystallizability Polymer (γ): addition polymer of a cyclic olefin monomer, having crystallizability Polymer (δ): hydrogenated product of polymer (γ), having crystallizability.

Specifically, the alicyclic structure-containing polymer is more preferably a ring-opening polymer of dicyclopentadiene having crystallizability and a hydrogenated product of the ring-opening polymer of dicyclopentadiene having crystallizability, and particularly preferably a hydrogenated product of the ring-opening polymer of dicyclopentadiene having crystallizability. Here, the ring-opening polymer of dicyclopentadiene refers to a polymer in which the ratio of a dicyclopentadiene-derived structural unit relative to all structural units is usually 50% by weight or more, preferably 70% by weight or more, more preferably 90% by weight or more, and further preferably 100% by weight.

Hereinafter, a method for producing the polymer (α) and the polymer (β) will be described.

The cyclic olefin monomer available for producing the polymer (α) and the polymer (β) is a compound which has a ring structure formed with carbon atoms and includes a carbon-carbon double bond in the ring. Examples of the cyclic olefin monomer may include a norbornene-based monomer. When the polymer (α) is a copolymer, a monocyclic olefin may be used as the cyclic olefin monomer.

The norbornene-based monomer is a monomer that contains a norbornene ring. Examples of the norbornene-based monomer may include: a bicyclic monomer such as bicyclo[2.2.1]hept-2-ene (common name: norbornene), and 5-ethylidene-bicyclo[2.2.1]hept-2-ene (common name: ethylidene norbornene) and derivatives thereof (for example, those with a substituent on the ring); a tricyclic monomer such as tricyclo[4.3.0.1$^{2,5}$]dec-3,7-diene (common name: dicyclopentadiene) and derivatives thereof; and a tetracyclic monomer such as 7,8-benzotricyclo[4.3.0.1$^{2,5}$]dec-3-ene (common name: methanotetrahydrofluorene: also referred to as 1,4-methano-1,4,4a,9a-tetrahydrofluorene) and derivatives thereof, tetracyclo[4.4.0.1$^{2-5}$.1$^{7,10}$]dodeca-3-ene (common name: tetracyclododecene), and 8-ethylidene tetracyclo [4.4.0.1$^{2-5}$.1$^{7,10}$]-3-dodecene and derivatives thereof.

Examples of the substituent in the aforementioned monomer may include: an alkyl group such as a methyl group and an ethyl group; an alkenyl group such as a vinyl group; an alkylidene group such as propane-2-ylidene; an aryl group such as a phenyl group; a hydroxy group; an acid anhydride group; a carboxyl group; and an alkoxycarbonyl group such as a methoxycarbonyl group. The monomer may solely contain one type of the aforementioned substituents, and may also contain two or more types thereof in combination at any ratio.

Examples of the monocyclic olefin may include: cyclic monoolefins such as cyclobutene, cyclopentene, methylcyclopentene, cyclohexene, methylcyclohexene, cycloheptene, and cyclooctene; and cyclic diolefins such as cyclohexadiene, methylcyclohexadiene, cyclooctadiene, methylcyclooctadiene, and phenylcyclooctadiene.

As the cyclic olefin monomer, one type thereof may be solely used, and two or more types thereof may also be used in combination at any ratio. When two or more types of the cyclic olefin monomers are used, the polymer (α) may be a block copolymer, or a random copolymer.

Some of the cyclic olefin monomers may allow presence of endo- and exo-stereoisomers. As the cyclic olefin monomer, any of the endo- and exo-isomers may be used. One of the endo- and exo-isomers may be solely used, and an isomer mixture containing the endo- and exo-isomers at any ratio may also be used. In particular, it is preferable that the ratio of one of the endo- and exo-isomers is at a high level because crystallizability of the alicyclic structure-containing polymer is thereby enhanced and a layer of the resin A having excellent heat resistance can thereby be easily obtained. For example, the ratio of the endo- or exo-isomer is preferably 80% or more, more preferably 90% or more, and further preferably 95% or more. It is preferable that the ratio of the endo-isomer is high because it can be easily synthesized.

In synthesis of the polymer (α), a ring-opening polymerization catalyst is usually used. As the ring-opening polymerization catalyst, one type thereof may be solely used, and two or more types thereof may also be used in combination at any ratio. It is preferable that such a ring-opening polymerization catalyst for synthesis of the polymer (α) is a ring-opening polymerization catalyst that may cause ring-opening polymerization of the cyclic olefin monomer to produce a ring-opening polymer having syndiotactic stereoregularity. Preferable examples of the ring-opening polymerization catalyst may include ring-opening polymerization catalysts including a metal compound represented by the following formula (1):

$$M(NR^{1i})X^{i}{}_{4-a}(OR^{2i})_{a}\cdot L_{b} \tag{1}$$

(wherein

M is a metal atom selected from the group consisting of the Group 6 transition metal atoms in the periodic table, $R^{1i}$ is a phenyl group optionally having a substituent at at least one of 3-, 4-, and 5-positions, or a group represented by —CH$_2$R$^{3i}$ (wherein R$^{3i}$ is a group selected from the group consisting of a hydrogen atom, an alkyl group optionally having a substituent, and an aryl group optionally having a substituent), $R^{2i}$ is a group selected from the group consisting of an alkyl group optionally having a substituent and an aryl group optionally having a substituent, $X^{i}$ is a group selected from the group consisting of a halogen atom, an alkyl group optionally having a substituent, an aryl group optionally having a substituent, and an alkylsilyl group, L is a neutral electron donor ligand, a is a number of 0 or 1, and b is an integer of 0 to 2.)

In the formula (1), M is a metal atom selected from the group consisting of the Group 6 transition metal atoms in the periodic table. M is preferably chromium, molybdenum, or tungsten, more preferably molybdenum or tungsten, and particularly preferably tungsten.

In the formula (1), $R^{1i}$ is a phenyl group optionally having a substituent at least one of the 3-, 4-, and 5-positions, or a group represented by —$CH_2R^{3i}$.

The number of carbon atoms of the phenyl group optionally having a substituent at at least one of the 3-, 4-, and 5-positions of $R^{1i}$ is preferably 6 to 20, and more preferably 6 to 15. Examples of the substituent may include an alkyl group such as a methyl group and an ethyl group; a halogen atom such as a fluorine atom, a chlorine atom, and a bromine atom; and an alkoxy group such as a methoxy group, an ethoxy group, and an isopropoxy group. As the substituent, one type thereof may be solely used, and two or more types thereof may also be used in combination at any ratio. In $R^{1i}$, the substituents present at at least two of the 3-, 4-, and 5-positions may be bonded to each other, to form a ring structure.

Examples of the phenyl group optionally having a substituent at at least one of the 3-, 4-, and 5-positions may include an unsubstituted phenyl group; a monosubstituted phenyl group such as a 4-methylphenyl group, a 4-chlorophenyl group, a 3-methoxyphenyl group, a 4-cyclohexylphenyl group, and a 4-methoxyphenyl group; a disubstituted phenyl group such as a 3,5-dimethylphenyl group, a 3,5-dichlorophenyl group, a 3,4-dimethylphenyl group, and a 3,5-dimethoxyphenyl group; a trisubstituted phenyl group such as a 3,4,5-trimethylphenyl group, and a 3,4,5-trichlorophenyl group; and a 2-naphthyl group optionally having a substituent such as a 2-naphthyl group, a 3-methyl-2-naphthyl group, and a 4-methyl-2-naphthyl group.

In the group represented by —$CH_2R^{3i}$ of $R^{1i}$, $R^{3i}$ is a group selected from the group consisting of a hydrogen atom, an alkyl group optionally having a substituent, and an aryl group optionally having a substituent.

The number of carbon atoms in the alkyl group optionally having a substituent of $R^{3i}$ is preferably 1 to 20, and more preferably 1 to 10. This alkyl group may be either linear or branched. Examples of the substituent may include a phenyl group optionally having a substituent such as a phenyl group and a 4-methylphenyl group; and an alkoxyl group such as a methoxy group and an ethoxy group. As the substituent, one type thereof may be solely used, and two or more types thereof may also be used in combination at any ratio.

Examples of the alkyl group optionally having a substituent of $R^{3i}$ may include a methyl group, an ethyl group, a propyl group, an isopropyl group, a butyl group, an isobutyl group, a t-butyl group, a pentyl group, a neopentyl group, a benzyl group, and a neophyl group.

The number of carbon atoms in the aryl group optionally having a substituent of $R^{3i}$ is preferably 6 to 20, and more preferably 6 to 15. Examples of the substituent may include an alkyl group such as a methyl group and an ethyl group; a halogen atom such as a fluorine atom, a chlorine atom, and a bromine atom; and an alkoxy group such as a methoxy group, an ethoxy group, and an isopropoxy group. As the substituent, one type thereof may be solely used, and two or more types thereof may also be used in combination at any ratio.

Examples of the aryl group optionally having a substituent of $R^{3i}$ may include a phenyl group, a 1-naphthyl group, a 2-naphthyl group, a 4-methylphenyl group, and a 2,6-dimethylphenyl group.

Among these, the group represented by $R^{3i}$ is preferably an alkyl group of 1 to 20 carbon atoms.

In the formula (1), $R^{2i}$ is a group selected from the group consisting of an alkyl group optionally having a substituent and an aryl group optionally having a substituent. As the alkyl group optionally having a substituent and the aryl group optionally having a substituent of $R^{2i}$, a group selected from groups shown as the alkyl groups optionally having a substituent and the aryl groups optionally having a substituent, respectively, of $R^{3i}$ may be optionally used.

In the formula (1), $X^i$ is a group selected from the group consisting of a halogen atom, an alkyl group optionally having a substituent, an aryl group optionally having a substituent, and an alkylsilyl group.

Examples of the halogen atom of $X^i$ may include a chlorine atom, a bromine atom, and an iodine atom.

As the alkyl group optionally having a substituent and the aryl group optionally having a substituent of $X^i$, a group selected from groups shown as the alkyl groups optionally having a substituent and the aryl groups optionally having a substituent, respectively, of $R^{3i}$ may be optionally used.

Examples of the alkylsilyl group of $X^i$ may include a trimethylsilyl group, a triethylsilyl group, and a t-butyldimethylsilyl group.

When the metal compound represented by the formula (1) has two or more $X^i$'s in one molecule, the $X^i$'s may be the same as or different from each other. Further, the two or more $X^i$'s may be bonded to each other to form a ring structure.

In the formula (1), L is a neutral electron donor ligand.

Examples of the neutral electron donor ligand of L may include an electron donor compound containing an atom of the Group 14 or 15 in the periodic table. Specific examples thereof may include phosphines such as trimethylphosphine, triisopropylphosphine, tricyclohexylphosphine, and triphenylphosphine; ethers such as diethyl ether, dibutyl ether, 1,2-dimethoxyethane, and tetrahydrofuran; and amines such as trimethylamine, triethylamine, pyridine, and lutidine. Among these, an ether is preferable. When the metal compound represented by the formula (1) has two or more L's in one molecule, the L's may be the same as or different from each other.

The metal compound represented by the formula (1) is preferably a tungsten compound having a phenylimido group. That is, a metal compound represented by the formula (1) wherein M is a tungsten atom and $R^{1i}$ is a phenyl group is preferable. In particular, a tetrachlorotungsten phenylimide(tetrahydrofuran) complex is more preferable.

The method for producing the metal compound represented by the formula (1) is not particularly limited. For example, as described in Japanese Patent Application Laid-open No. Hei. 5-345817 A, the metal compound represented by the formula (1) may be produced by mixing an oxyhalogenated product of a Group 6 transition metal; a phenyl isocyanate optionally having a substituent at at least one of the 3-, 4-, and 5-positions or a monosubstituted methyl isocyanate; a neutral electron donor ligand (L); and if necessary, an alcohol, a metal alkoxide, and a metal aryloxide.

In the aforementioned production method, the metal compound represented by the formula (1) is usually obtained in a state where the compound is contained in a reaction liquid. After production of the metal compound, the aforementioned reaction liquid as it is may be used as a catalyst liquid for the ring-opening polymerization reaction. Alternatively, the metal compound may be isolated from the reaction liquid and purified by a purification treatment such as crystallization, and the resulting metal compound may be used for the ring-opening polymerization reaction.

As the ring-opening polymerization catalyst, the metal compound represented by the formula (1) may be solely used. Alternatively, the metal compound represented by the formula (1) may be used in combination with another component. For example, the metal compound represented by the formula (1) may be used in combination with an organometallic reductant, to enhance polymerization activity.

Examples of the organometallic reductant may include organometallic compounds of Groups 1, 2, 12, 13, and 14 in the periodic table, having a hydrocarbon group of 1 to 20 carbon atoms. Examples of such organometallic compounds may include an organolithium such as methyllithium, n-butyllithium, and phenyllithium; an organomagnesium such as butylethylmagnesium, butyloctylmagnesium, dihexylmagnesium, ethylmagnesium chloride, n-butylmagnesium chloride, and allylmagnesium bromide; an organozinc such as dimethylzinc, diethylzinc, and diphenylzinc; an organoaluminum such as trimethylaluminum, triethylaluminum, triisobutylaluminum, diethylaluminum chloride, ethylaluminum sesquichloride, ethylaluminum dichloride, diethylaluminum ethoxide, diisobutylaluminum isobutoxide, ethylaluminum diethoxide, and isobutylaluminum diisobutoxide; and an organotin such as tetramethyltin, tetra(n-butyl)tin, and tetraphenyltin. Among these, an organoaluminum and an organotin are preferable. As the organometallic reductant, one type thereof may be solely used, and two or more types thereof may also be used in combination at any ratio.

The ring-opening polymerization reaction is usually performed in an organic solvent. As the organic solvent, an organic solvent that allows the ring-opening polymer and a hydrogenated product thereof to be dissolved or dispersed under specific conditions and does not inhibit the ring-opening polymerization reaction and a hydrogenation reaction may be used. Examples of such an organic solvent may include an aliphatic hydrocarbon solvent such as pentane, hexane, and heptane; an alicyclic hydrocarbon solvent such as cyclopentane, cyclohexane, methylcyclohexane, dimethylcyclohexane, trimethylcyclohexane, ethylcyclohexane, diethylcyclohexane, decahydronaphthalene, bicycloheptane, tricyclodecane, hexahydroindene, and cyclooctane; an aromatic hydrocarbon solvent such as benzene, toluene, and xylene; a halogenated aliphatic hydrocarbon solvent such as dichloromethane, chloroform, and 1,2-dichloroethane; a halogenated aromatic hydrocarbon solvent such as chlorobenzene, and dichlorobenzene; a nitrogen-containing hydrocarbon solvent such as nitromethane, nitrobenzene, and acetonitrile; an ether solvent such as diethyl ether, and tetrahydrofuran; and a mixed solvent that is a combination thereof. Among these, the organic solvent is preferably an aromatic hydrocarbon solvent, an aliphatic hydrocarbon solvent, an alicyclic hydrocarbon solvent, or an ether solvent.

The ring-opening polymerization reaction may be initiated by mixing the cyclic olefin monomer, the metal compound represented by the formula (1), and if necessary, the organometallic reductant. The order of mixing the components is not particularly limited. For example, a solution containing the metal compound represented by the formula (1) and the organometallic reductant may be mixed in a solution containing the cyclic olefin monomer. Alternatively, a solution containing the cyclic olefin monomer and the metal compound represented by the formula (1) may be mixed in a solution containing the organometallic reductant. Further, a solution containing the metal compound represented by the formula (1) may be mixed in a solution containing the cyclic olefin monomer and the organometallic reductant. When the respective components are mixed, the total amount of each of the components may be mixed once, or the components may be mixed in a plurality of batches. The components may also be continuously mixed over a relatively long period of time (for example, 1 or more minutes).

The concentration of the cyclic olefin monomer in the reaction liquid at the time of starting the ring-opening polymerization reaction is preferably 1% by weight or more, more preferably 2% by weight or more, and particularly preferably 3% by weight or more, and is preferably 50% by weight or less, more preferably 45% by weight or less, and particularly preferably 40% by weight or less. When the concentration of the cyclic olefin monomer is equal to or more than the lower limit value of the aforementioned ranges, productivity can be enhanced. When the concentration thereof is equal to or less than the upper limit value, viscosity of the reaction liquid after the ring-opening polymerization reaction can be decreased. Therefore, the subsequent hydrogenation reaction can be facilitated.

The amount of the metal compound represented by the formula (1) used in the ring-opening polymerization reaction is desirably set so that the molar ratio of "metal compound: cyclic olefin monomer" falls within a specific range. Specifically, the aforementioned molar ratio is preferably 1:100 to 1:2,000,000, more preferably 1:500 to 1,000,000, and particularly preferably 1:1,000 to 1:500,000. When the amount of the metal compound is equal to or more than the lower limit value of the aforementioned ranges, sufficient polymerization activity can be obtained. When the amount thereof is equal to or less than the upper limit value, the metal compound can be easily removed after the reaction.

The amount of the organometallic reductant is preferably 0.1 mol or more, more preferably 0.2 mol or more, and particularly preferably 0.5 mol or more, and is preferably 100 mol or less, more preferably 50 mol or less, and particularly preferably 20 mol or less, relative to 1 mol of the metal compound represented by the formula (1). When the amount of the organometallic reductant is equal to or more than the lower limit value of the aforementioned ranges, polymerization activity can be sufficiently enhanced. When the amount thereof is equal to or less than the upper limit value, occurrence of a side reaction can be suppressed.

The polymerization reaction system of the polymer (α) may contain an activity adjuster. When the activity adjuster is used, the ring-opening polymerization catalyst can be stabilized, the reaction speed of the ring-opening polymerization reaction can be controlled, and the molecular weight distribution of the polymer can be adjusted.

As the activity adjuster, an organic compound having a functional group may be used. Examples of the activity adjuster may include an oxygen-containing compound, a nitrogen-containing compound, and a phosphorus-containing organic compound.

Examples of the oxygen-containing compound may include: ethers such as diethyl ether, diisopropyl ether, dibutyl ether, anisole, furan, and tetrahydrofuran; ketones such as acetone, benzophenone, and cyclohexanone; and esters such as ethyl acetate.

Examples of the nitrogen-containing compound may include: nitriles such as acetonitrile and benzonitrile; amines such as triethylamine, triisopropylamine, quinuclidine, and N,N-diethylaniline; and pyridines such as pyridine, 2,4-lutidine, 2,6-lutidine, and 2-t-butylpyridine.

Examples of the phosphorous-containing compound may include: phosphines such as triphenyl phosphine, tricyclohexyl phosphine, triphenyl phosphate, and trimethyl phosphate; and phosphine oxides such as triphenyl phosphine oxide.

As the activity adjuster, one type thereof may be solely used, and two or more types thereof may also be used in combination at any ratio.

The amount of the activity adjuster in the polymerization reaction system of the polymer (α) is preferably 0.01 mol % to 100 mol % relative to 100 mol % of the metal compound represented by the formula (1).

In order to adjust the molecular weight of the polymer (α), the polymerization reaction system of the polymer (α) may contain a molecular weight adjuster. Examples of the molecular weight adjuster may include: α-olefins such as 1-butene, 1-pentene, 1-hexene, and 1-octene; an aromatic vinyl compound such as styrene and vinyltoluene; an oxygen-containing vinyl compound such as ethyl vinyl ether, isobutyl vinyl ether, allyl glycidyl ether, allyl acetate, allyl alcohol, and glycidyl methacrylate; a halogen-containing vinyl compound such as allyl chloride; a nitrogen-containing vinyl compound such as acrylamide; non-conjugated diene such as 1,4-pentadiene, 1,4-hexadiene, 1,5-hexadiene, 1,6-heptadiene, 2-methyl-1,4-pentadiene, and 2,5-dimethyl-1,5-hexadiene; and conjugated diene such as 1,3-butadiene, 2-methyl-1,3-butadiene, 2,3-dimethyl-1,3-butadiene, 1,3-pentadiene, and 1,3-hexadiene.

As the molecular weight adjuster, one type thereof may be solely used, and two or more types thereof may also be used in combination at any ratio.

The amount of the molecular weight adjuster in the polymerization reaction system for polymerizing the polymer (α) may be appropriately determined depending on an intended molecular weight. The specific amount of the molecular weight adjuster is preferably 0.1 mol % to 50 mol % relative to the cyclic olefin monomer.

The polymerization temperature is preferably −78° C. or higher, and more preferably −30° C. or higher, and is preferably +200° C. or lower, and more preferably +180° C. or lower.

The polymerization time may be dependent on reaction scale. The specific polymerization time is preferably in the range of 1 minute to 1000 hours.

By the aforementioned production method, the polymer (α) may be obtained. By hydrogenating this polymer (α), the polymer (β) may be produced.

For example, the polymer (α) may be hydrogenated by supplying hydrogen into the reaction system containing the polymer (α) in the presence of a hydrogenation catalyst according to an ordinary method. When reaction conditions in this hydrogenation reaction are appropriately set, the tacticity of the hydrogenated product is not usually altered by the hydrogenation reaction.

As the hydrogenation catalyst, a homogeneous catalyst or inhomogeneous catalyst that is publicly known as a hydrogenation catalyst for an olefin compound may be used.

Examples of the homogeneous catalyst may include a catalyst including a combination of a transition metal compound and an alkali metal compound such as cobalt acetate/triethylaluminum, nickel acetylacetonate/triisobutylaluminum, titanocene dichloride/n-butyllithium, zirconocene dichloride/sec-butyllithium, and tetrabutoxy titanate/dimethylmagnesium; and a noble metal complex catalyst such as dichlorobis(triphenylphosphine)palladium, chlorohydridecarbonyltris(triphenylphosphine)ruthenium, chlorohydridecarbonylbis(tricyclohexylphosphine)ruthenium, bis(tricyclohexylphosphine)benzylidyne ruthenium (IV) dichloride, and chlorotris(triphenylphosphine)rhodium.

Examples of the inhomogeneous catalyst may include a metal catalyst such as nickel, palladium, platinum, rhodium, and ruthenium; and a solid catalyst in which the aforementioned metals are supported on a carrier such as carbon, silica, diatomaceous earth, alumina, and titanium oxide, such as nickel/silica, nickel/diatomaceous earth, nickel/alumina, palladium/carbon, palladium/silica, palladium/diatomaceous earth, and palladium/alumina.

As the hydrogenation catalyst, one type thereof may be solely used, and two or more types thereof may also be used in combination at any ratio.

The hydrogenation reaction is usually performed in an inert organic solvent. Examples of the inert organic solvent may include: an aromatic hydrocarbon solvent such as benzene and toluene; an aliphatic hydrocarbon solvent such as pentane and hexane; an alicyclic hydrocarbon solvent such as cyclohexane and decahydronaphthalene; and an ether solvent such as tetrahydrofuran and ethylene glycol dimethyl ether. As the inert organic solvent, one type thereof may be solely used, and two or more types thereof may also be used in combination at any ratio. The inert organic solvent may be the same as or different from the organic solvent used in the ring-opening polymerization reaction. Furthermore, the hydrogenation reaction may be performed by adding the hydrogenation catalyst to the reaction liquid of the ring-opening polymerization reaction.

The reaction conditions for the hydrogenation reaction usually vary depending on the hydrogenation catalyst used.

The reaction temperature of the hydrogenation reaction is preferably −20° C. or higher, more preferably −10° C. or higher, and particularly preferably 0° C. or higher, and is preferably +250° C. or lower, more preferably +220° C. or lower, and particularly preferably +200° C. or lower. When the reaction temperature is equal to or higher than the lower limit value of the aforementioned ranges, the reaction rate can be increased. When the reaction temperature is equal to or lower than the upper limit value, occurrence of a side reaction can be suppressed.

The hydrogen pressure is preferably 0.01 MPa or more, more preferably 0.05 MPa or more, and particularly preferably 0.1 MPa or more, and is preferably 20 MPa or less, more preferably 15 MPa or less, and particularly preferably 10 MPa or less. When the hydrogen pressure is equal to or more than the lower limit value of the aforementioned ranges, the reaction rate can be increased. When the hydrogen pressure is equal to or less than the upper limit value, a special apparatus such as a high pressure resistant reaction vessel is not required, and thereby facility costs can be suppressed.

The reaction time of the hydrogenation reaction may be set to any time period during which a desired hydrogenation rate is achieved, and preferably 0.1 hour to 10 hours.

After the hydrogenation reaction, the polymer (β), which is the hydrogenated product of the polymer (α), is usually collected according to an ordinary method.

The hydrogenation rate (the ratio of a hydrogenated main-chain double bond) in the hydrogenation reaction is preferably 98% or more, and more preferably 99% or more. As the hydrogenation rate becomes higher, the heat resistance of the alicyclic structure-containing polymer can be made more favorable.

Here, the hydrogenation rate of the polymer may be measured by a $^1$H-NMR measurement at 145° C., with o-dichlorobenzene-$d^4$ as a solvent.

Subsequently, the method for producing the polymer (γ) and the polymer (δ) will be described.

The cyclic olefin monomer to be used for producing the polymers (γ) and (δ) may be optionally selected from the range shown as the cyclic olefin monomers to be used for producing the polymer (α) and the polymer (β). As the cyclic olefin monomer, one type thereof may be solely used, and two or more types thereof may also be used in combination at any ratio.

In the production of the polymer (γ), an optional monomer which is copolymerizable with a cyclic olefin monomer may be used as a monomer in combination with the cyclic olefin monomer. Examples of the optional monomer may include: α-olefin of 2 to 20 carbon atoms such as ethylene, propylene, 1-butene, 1-pentene, and 1-hexene; an aromatic ring vinyl compound such as styrene and α-methylstyrene; and non-conjugated diene such as 1,4-hexadiene, 4-methyl-1,4-hexadiene, 5-methyl-1,4-hexadiene, and 1,7-octadiene. Of these, α-olefin is preferable, and ethylene is more preferable. As the optional monomer, one type thereof may be solely used, and two or more types thereof may also be used in combination at any ratio.

The ratio between the cyclic olefin monomer and the optional monomer in terms of a weight ratio (cyclic olefin monomer:optional monomer) is preferably 30:70 to 99:1, more preferably 50:50 to 97:3, and particularly preferably 70:30 to 95:5.

When two or more types of cyclic olefin monomers are used, or when the cyclic olefin monomer and the optional monomer are used in combination, the polymer (γ) may be a block copolymer, or a random copolymer.

For the synthesis of the polymer (γ), an addition polymerization catalyst is usually used. Examples of the addition polymerization catalyst may include a vanadium-based catalyst formed from a vanadium compound and an organoaluminum compound, a titanium-based catalyst formed from a titanium compound and an organoaluminum compound, and a zirconium-based catalyst formed from a zirconium complex and aluminoxane. As the addition polymerization catalyst, one type thereof may be solely used, and two or more types thereof may also be used in combination at any ratio.

The amount of the addition polymerization catalyst is preferably 0.000001 mol or more, and more preferably 0.00001 mol or more, and is preferably 0.1 mol or less, and more preferably 0.01 mol or less, relative to 1 mol of a monomer.

The addition polymerization of a cyclic olefin monomer is usually performed in an organic solvent. The organic solvent may be optionally selected from the range shown as the organic solvents to be used for the ring-opening polymerization of a cyclic olefin monomer. As the organic solvent, one type thereof may be solely used, and two or more types thereof may also be used in combination at any ratio.

The polymerization temperature in the polymerization for producing the polymer (γ) is preferably −50° C. or higher, more preferably −30° C. or higher, and particularly preferably −20° C. or higher, and is preferably 250° C. or lower, more preferably 200° C. or lower, and particularly preferably 150° C. or lower. The polymerization time is preferably 30 minutes or more, and more preferably 1 hour or more, and is preferably 20 hours or less, and more preferably 10 hours or less.

By the aforementioned production method, the polymer (γ) may be obtained. By hydrogenating this polymer (γ), the polymer (δ) may be produced.

The hydrogenation of the polymer (γ) may be performed by a similar method to the method previously described as the method for hydrogenating the polymer (α).

Preferably, the crystallizable alicyclic structure-containing polymer has a syndiotactic structure. More preferably, the degree of the syndiotactic stereoregularity of the syndiotactic structure is high. This can increase the crystallizability of the alicyclic structure-containing polymer. Therefore, the tensile modulus can be particularly increased. The degree of the syndiotactic stereoregularity of the alicyclic structure-containing polymer may be represented by the ratio of the racemo diad of the alicyclic structure-containing polymer. The specific ratio of the racemo diad of the alicyclic structure-containing polymer is preferably 51% or more, more preferably 60% or more, and particularly preferably 70% or more.

The ratio of the racemo diad may be measured by $^{13}$C-NMR spectrum analysis. Specifically, the measurement may be performed by the following method.

The $^{13}$C-NMR measurement of a polymer sample is performed at 200° C. with ortho-dichlorobenzene-d$^4$ as a solvent by an inverse-gated decoupling method. From the result of this $^{13}$C-NMR measurement, a signal at 43.35 ppm derived from the meso diad and a signal at 43.43 ppm derived from the racemo diad may be identified with the peak at 127.5 ppm of ortho-dichlorobenzene-d$^4$ as a reference shift, and the ratio of the racemo diad of the polymer sample may be determined on the basis of the ratio of the signal strength.

The ratio of the polymer A in the resin A is preferably 50% by weight or more, more preferably 70% by weight or more, and particularly preferably 90% by weight or more. When the ratio of the polymer A is equal to or more than the lower limit value of the aforementioned ranges, the layer of the resin A can have enhanced heat resistance and tensile modulus.

The crystallization of the polymer A contained in the layer of the resin A may not be in a proceeded state before the production of the layer of the resin A, but preferably be in a sufficiently proceeded state after the production of the layer of the resin A. The specific crystallization degree of the polymer A contained in the layer of the resin A is preferably 10% or more, more preferably 15% or more, and particularly preferably 20% or more. When the crystallization degree is equal to or more than the lower limit value of the aforementioned ranges, the layer of the resin A can have favorable properties such as high heat resistance, chemical resistance, and tensile modulus. The upper limit of the crystallization degree is not particularly limited, but is preferably 70% or less, more preferably 60% or less, and particularly preferably 50% or less, from the viewpoint of transparency of the layer of the resin A. The crystallization degree of the polymer may be measured by an X-ray diffraction method.

The resin as the material for the layer of the resin A may contain an optional component in combination with the aforementioned polymer. Examples of the optional component may include: an antioxidant such as a phenol-based antioxidant, a phosphorus-based antioxidant, and a sulfur-based antioxidant; a photostabilizer such as a hindered amine-based photostabilizer; wax such as petroleum-based wax, Fischer-Tropsch wax, and polyalkylene wax; a nucleating agent such as a sorbitol-based compound, a metal salt of an organic phosphoric acid, a metal salt of an organic carboxylic acid, kaolin, and talc; a fluorescent brightener such as a diaminostilbene derivative, a coumarin derivative, an azole-based derivative (for example, a benzoxazole derivative, a benzotriazole derivative, a benzimidazole derivative, and a benzothiazole derivative), a carbazole derivative, a pyridine derivative, a naphthalic acid derivative, and an imidazolone derivative; a ultraviolet absorber such as a benzophenone-based ultraviolet absorber, a salicylic acid-based ultraviolet absorber, and a benzotriazole-based ultraviolet absorber; an inorganic filler such as talc, silica, calcium carbonate, and glass fiber; a colorant; a flame retardant; a flame retardant auxiliary; an antistatic agent; a plasticizer; a near-infrared absorber; a lubricant; and a filler. As the optional component, one type thereof may be solely used, and two or more types thereof may also be used in combination at any ratio.

The polymer A is preferably an alicyclic structure-containing polymer having a positive intrinsic birefringence value. The resin having a positive intrinsic birefringence value means a resin that expresses a refractive index in a stretching direction which is larger than the refractive index in a direction orthogonal to the stretching direction. The intrinsic birefringence value may be calculated from a dielectric constant distribution. When the alicyclic structure-containing polymer having a positive intrinsic birefringence value is adopted as the polymer A, there can be easily obtained a layer of the resin A having favorable properties such as a high orientation regulating force, high strength, low costs, and low thermal size change ratios.

The absolute value of the photoelastic coefficient of the layer of the resin A is $2.0 \times 10^{-11}$ $Pa^{-1}$ or less, more preferably $1.0 \times 10^{-11}$ $Pa^{-1}$ or less, and particularly preferably $6.0 \times 10^{-12}$ $Pa^{-1}$ or less. The photoelastic coefficient is a value indicating stress dependence of birefringence generated when subjected to stress, and has a relationship in which a difference $\Delta n$ in the refractive index is calculated as the product ($\Delta n = C \times \sigma$) of stress $\sigma$ and a photoelastic coefficient $C$. When the absolute value of the photoelastic coefficient is the aforementioned upper limit or less, favorable optical properties can be exhibited even when the layer is subjected to impact or deformed to be adapted to a display device having a curved display surface. The photoelastic coefficient may be measured under the conditions of 20° C.±2° C. in temperature and 60±5% in humidity, using a photoelastic coefficient measuring device (PHEL-20A manufactured by Uniopt Co., Ltd.). Alternatively, the photoelastic coefficient may be the slope of a load $-\Delta n$ curve created by measuring the in-plane retardation of the film using a retardation measuring device ("KOBRA-21ADH" manufactured by Oji Scientific Instruments) while applying a load of 50 to 150 g onto the film, dividing the measured retardation by the thickness of the film to calculate a birefringence value $\Delta n$, and calculating $\Delta n$ while changing the load. The lower limit value of the photoelastic coefficient for the layer of the resin A is not particularly limited, but may be, for example, $0.5 \times 10^{-12}$ $Pa^{-1}$ or more.

It is preferable that the absolute value of the thermal size change ratio in a plane of the film when the layer of the resin A is heated is a particular small value. Specifically, the absolute value of the thermal size change ratio in a plane of the film when the film is heated at 150° C. for 1 hour is preferably 1% or less, more preferably 0.5% or less, and further more preferably 0.1% or less. The lower limit of the absolute value of the thermal size change ratio is not particularly limited, but may be ideally 0%. Since the layer of the resin A usually shrinks under high temperature environments, the aforementioned thermal size change ratio usually becomes a negative value. By having such a low absolute value of the thermal size change ratio, occurrence of failures due to the formation of the barrier layer can be suppressed, and production of a high quality multilayer film can be facilitated. In addition, when the multilayer film is used as a component of an organic electroluminescent display device, high durability and excellent optical properties can be exhibited.

The thermal size change ratio of a film such as the layer of the resin A may be measured by the following method.

A film is cut out at the room temperature 23° C. to provide a sample film of a square shape having a size of 150 mm×150 mm. This sample film is heated in an oven at 150° C. for 60 minutes, and cooled down to 23° C. (room temperature). After that, the lengths of four sides and the lengths of two diagonals of the sample film are measured.

On the basis of the measured length of each of the four sides, the thermal size change ratio of the sample film is calculated according to the following equation (I). In the equation (I), $L_A$ stands for the length of a side of the sample film after heating.

$$\text{Thermal size change ratio (\%)} = [(L_A - 150)/150] \times 100 \qquad (I)$$

Also, on the basis the measured lengths of two diagonals, the thermal size change ratio of the sample film is calculated according to the following equation (II). In the equation (II), $L_D$ stands for the length of a diagonal of the sample film after heating.

$$\text{Thermal size change ratio (\%)} = [(L_D - 212.13)/212.13] \times 100 \qquad (II)$$

Then, the maximum absolute value among the obtained six calculated thermal size change ratios is adopted as the thermal size change ratio of the film. The thermal size change ratio obtained by such measurement can substantially be the maximum value of the thermal size change ratios measured in all in-plane directions.

The birefringence $\Delta n$ of the layer of the resin A is preferably 0.0010 or more, and more preferably 0.003 or more. The upper limit of the birefringence $\Delta n$ is not particularly limited, but is usually 0.1 or less. When the birefringence of the layer of the resin A is equal to or more than the aforementioned lower limit value, a multilayer film which has desired optical properties and nevertheless has a thin thickness can be obtained.

3. Layer Structure of Phase Difference Film

It is preferable from the viewpoint of production efficiency that the multilayer film according to the present invention is formed as a film having a long-length shape. Specifically, the multilayer film of the present invention may be formed as a film having a long-length shape, and as necessary, may be cut into a shape that fits with the shape of a display device. From the viewpoint of producing such a multilayer film, it is preferable that the phase difference film used for the production of the multilayer film is also a film having a long-length shape.

The phase difference film may be constituted of the layer of the resin A alone. Alternatively, the phase difference film may include an optional layer in addition to the layer of the resin A. In a preferred aspect, the phase difference film includes as a layer having a phase difference only a ¼ wave plate that is the layer of the resin A, or includes a ¼ wave plate as a layer of the resin A and further includes a ½ wave plate. Hereinafter, the former may be referred to as a "single layer type" and the latter may be referred to as a "double layer type". The thickness of the phase difference film is usually preferably 1 μm or more, and more preferably 3 μm or more, and is usually preferably 500 μm or less, more preferably 200 μm or less, and particularly preferably 100 μm or less. In a double layer type phase difference film, the ½ wave plate may be the layer of the resin A, and may also be a layer formed of a material other than the resin A. As the material constituting the optional layer, a material known as a material for optical films may be appropriately selected and used. The thickness of the double layer type phase difference film refers to the total sum of the thicknesses of the ¼ wave plate and the ½ wave plate. From the viewpoint of optical properties and mechanical reinforcing performance of the single layer type or double layer type phase difference film, a resin containing an alicyclic structure-containing polymer is preferable. Examples of the resin containing an alicyclic structure-containing polymer used may include commercially available products (for example, trade name "ZEONOR" manufactured by ZEON Corporation, trade name "ARTON" manufactured by JSR Corporation, trade name "APEL" manufactured by Mitsui Chemical, Inc., and trade name "TOPAS" manufactured by Topas Advanced Polymers). Preferable ranges of the photoelastic coefficient and birefringence of the ½ wave plate in the double layer type phase difference film may be the same ranges of the photoelastic coefficient and birefringence of the layer of the resin A as described above.

The ¼ wave plate constituting the phase difference film may be a layer having an in-plane retardation Re of 108 nm or more, and preferably 116 nm or more, and of 168 nm or less, and preferably 156 nm or less, where the in-plane retardation Re is measured with the light having a wavelength of 590 nm. When the phase difference film includes the ½ wave plate, the ½ wave plate has an in-plane retardation Re of 240 nm or more, and preferably 250 nm or more, and of 300 nm or less, preferably 280 nm or less, and more preferably 270 nm or less, where the in-plane retardation Re is measured with light having a wavelength of 590 nm. By configuring these components such that such a ¼ wave plate and a ½ wave plate are included and the entirety of the phase difference film functions as a ¼ wave plate, a phase difference film that functions as a ¼ wave plate in a wide wavelength band can be obtained. In the present invention, the phase difference film itself may also function as a ¼ wave plate. In the following description relating to the phase difference film using a ½ wave plate and a ¼ wave plate in combination, however, the ¼ wave plate constituting the phase difference film is simply referred to as a "¼ wave plate" when it is apparent in the context.

In the double layer type phase difference film, the slow axis of the ½ wave plate and the slow axis of the ¼ wave plate are each preferably in an oblique direction relative to the long-length direction of the multilayer film. Most of long-length linear polarizers which are easily available have their transmission axes in the width direction. When such a liner polarizer is adopted in combination with such a phase difference film including a ½ wave plate and a ¼ wave plate, the phase difference film functioning as an ideal ¼ wave plate in a wide wavelength band can be particularly easily produced.

The angle of intersection between the slow axis of the ½ wave plate and the slow axis of the ¼ wave plate in the double layer type phase difference film is preferably 55° or larger, more preferably 56° or larger, and further more preferably 57° or larger, and is preferably 65° or smaller, more preferably 64° or smaller, and further more preferably 63° or smaller. When the angle of intersection is within such a specific range, the phase difference film functioning as an ideal ¼ wave plate in a wide wavelength band can be particularly easily produced.

In the double layer type phase difference film, the values of the thickness dh of the ½ wave plate and the thickness dq of the ¼ wave plate, and the relation between these may be appropriately adjusted so as to provide desired mechanical properties and optical properties. It is preferable that the values of dh and dq are each 10 μm or more and 50 μm or less, and these values satisfy the relation of dh dq. When the values of dh and dq of the phase difference film are within such ranges, a multilayer film which has desired optical properties and nevertheless has a thin thickness can be easily formed. Specifically, the ½ wave plate can exhibit a function as a reinforcing layer for the ¼ wave plate during the formation of a barrier layer on the surface of the ¼ wave plate, whereby a high quality multilayer film can be easily formed.

The total light transmittance of the entire phase difference film is preferably 85% or more, and more preferably 92% or more. The upper limit is ideally 100%. Herein, the total light transmittance may be measured in accordance with JIS K7361-1997.

The phase difference film may preferably has a low haze. Specifically, the haze of the entire phase difference film is usually 10% or less, preferably 5% or less, and more preferably 1% or less. The lower limit value is ideally 0, but usually 0.1% or more. Herein, the haze may be measured in accordance with JIS K7361-1997.

The phase difference film preferably has a hardness of B or higher in terms of JIS pencil hardness. The control of this JIS pencil hardness may be achieved by adjusting the material and thickness of the substrate, for example. The JIS pencil hardness is determined by scratching the surface of the film with pencils in accordance with JIS K5600-5-4. Scratching is performed with pencils with a variety of hardness which are inclined at the angle of 45° to which 500 gram force of downward load is applied. The hardness is determined as the hardness of the pencil that begins to create scratches.

4. Method for Producing Phase Difference Film

The phase difference film may be produced by any production method. When the phase difference film is constituted of the layer of the resin A alone, the phase difference film may be produced by the below-described method for producing the resin A. When the phase difference film includes the layer of the resin A and an optional layer, these layers may be separately prepared and bonded to each other to produce the phase difference film. For example, when a double layer type phase difference film is to be produced, the ½ wave plate and the ¼ wave plate are separately prepared and then bonded to each other. Thus, the phase difference film containing these can be produced.

The bonding of the layers constituting the phase difference film may be achieved by interposing an adhesive layer therebetween. An adhesive, which is a material of the adhesive layer, encompasses not only an adhesive in a narrow sense (a so-called hot-melt type adhesive having a shear storage modulus of 1 to 500 MPa at 23° C. and having no tackiness at room temperature) but also a tackiness agent having a shear storage modulus of less than 1 MPa at 23° C. Specifically, a transparent adhesive having a refractive index close to those of the substrate plate or a transparent resin layer may appropriately be used. More specifically, an acrylic adhesive and an acrylic tackiness agent may be mentioned. The thickness of the adhesive layer is preferably 5 to 100 μm.

The ½ wave plate and the ¼ wave plate are each preferably a stretched film after subjected to oblique stretching one or more times. That is, it is preferable that the ½ wave plate and the ¼ wave plate are produced by a production method including one or more times of oblique stretching. By such a production method, the multilayer film having desired optical properties can be easily produced. By the bonding of these films, a phase difference film including the ½ wave plate and the ¼ wave plate can be produced.

The ½ wave plate and the ¼ wave plate for use in a method for producing a double layer type phase difference film are each preferably produced as a long-length film. These long-length films are produced, and bonded to each other via an appropriate adhesive layer by the roll-to-roll process while their lengthwise directions are aligned in parallel with each other. As a result, a long-length phase difference film can be efficiently produced, and also using the resulting film the multilayer film can be efficiently produced.

5. Method for Producing ¼ Wave Plate as Layer of Resin A

A specific description will now be given of an example of a method for producing the ¼ wave plate as the layer of the resin A. The ¼ wave plate obtained by this production method may be used as the component of the single layer type or double layer type phase difference film. The method for producing the ¼ wave plate in this example includes the following steps (i) to (iii):

Step (i): a step of preparing a pre-stretch film as a resin film formed of the resin A;

Step (ii): a step of stretching the pre-stretch film to obtain a stretched film; and Step (iii): a step of relaxing a strain of the stretched film while the stretched film is maintained flat to obtain the ¼ wave plate.

Furthermore, the production method of this example may preferably further include:

Step (iv): a step of promoting crystallization of the polymer A contained in the stretched film after obtaining the stretched film and before relaxing the strain of the stretched film.

5.1. Step (i)

The step (i) may be performed by molding the resin A into a film shape by a resin molding method, such as an injection molding method, an extrusion molding method, a press molding method, an inflation molding method, a blow molding method, a calendar molding method, a cast molding method, or a compression molding method. Among these, from the viewpoint of efficient production of the long-length pre-stretch film and facilitation of thickness control, an extrusion molding method is preferable.

When the pre-stretch film is produced by the extrusion molding method, the production conditions in the extrusion molding method are preferably as follows. The temperature of a cylinder (melted resin temperature) is preferably Tm or higher, and more preferably Tm+20° C. or higher, and is preferably Tm+100° C. or lower, and more preferably Tm+50° C. or lower. The temperature of a casting roll is preferably Tg−50° C. or higher, and is preferably Tg+70° C. or lower, and more preferably Tg+40° C. or lower. The temperature of a cooling roll is preferably Tg−70° C. or higher, and more preferably Tg−50° C. or higher, and is preferably Tg+60° C. or lower, and more preferably Tg+30° C. or lower. When a pre-stretch film is produced under these conditions, the pre-stretch film having a desired thickness, such as a thickness of 1 μm to 1 mm, can be easily produced.

The term "Tm" used herein represents the melting point of the polymer A, and the term "Tg" used herein represents the glass transition temperature of the polymer A.

The pre-stretch film produced by the step (i) is preferably a long-length film. When such a long-length film is used in the later steps, efficient production can be achieved.

5.2. Step (ii)

The stretching direction in the step (ii) may be appropriately set depending on a desired orientation direction required for the phase difference film.

The stretching method is not particularly limited, and may adopt any stretching method. Examples of the stretching method may include a uniaxial stretching method such as a method of uniaxially stretching the pre-stretch film in a lengthwise direction (longitudinal uniaxial stretching method) and a method of uniaxially stretching the pre-stretch film in a width direction (transversal uniaxial stretching method); a biaxial stretching method such as a simultaneous biaxial stretching method of stretching the pre-stretch film in the width direction at the same time as stretching the pre-stretch film in the lengthwise direction and a sequential biaxial stretching method of stretching the pre-stretch film in one of the lengthwise and width directions, followed by stretching the pre-stretch film in the other direction; a method of stretching the pre-stretch film in an oblique direction that is not parallel to or perpendicular to the width direction (oblique stretching method); and combinations thereof. In particular, as described above, the stretching including one or more times of the oblique stretching is preferable.

Examples of the longitudinal uniaxial stretching may include a stretching method utilizing a difference in a peripheral speed between rolls.

Examples of the transversal uniaxial stretching method may include a stretching method using a tenter stretching machine.

Examples of the simultaneous biaxial stretching method described above may include a stretching method using a tenter stretching machine provided with a plurality of clips that are provided so as to be movable along a guide rail and be capable of fixing the pre-stretch film, wherein the pre-stretch film is stretched in the lengthwise direction by increasing intervals between the clips, and simultaneously stretched in the width direction using a spreading angle of the guide rail.

Examples of the sequential biaxial stretching method may include a stretching method in which the pre-stretch film is stretched in the lengthwise direction using a difference in a peripheral speed between rolls, both ends of the pre-stretch film are then gripped by clips, and the pre-stretch film is stretched in the width direction by a tenter stretching machine.

Examples of the oblique stretching method may include a stretching method in which the pre-stretch film is continuously stretched in the oblique direction using a tenter stretching machine that is capable of applying a feeding force, a pulling force, or a drawing force to the pre-stretch film at different speeds on left and right sides in the lengthwise or width direction.

The stretching temperature during stretching of the pre-stretch film is preferably (Tg−30° C.) or higher, more preferably (Tg−20° C.) or higher, and particularly preferably (Tg−10° C.) or higher, and is preferably (Tg+60° C.) or lower, more preferably (Tg+50° C.) or lower, and particularly preferably (Tg+40° C.) or lower. Herein, the term "Tg"

represents the glass transition temperature of the polymer A. When the stretching is performed at such a temperature range, the polymer molecules contained in the stretched film can be appropriately oriented.

The stretching ratio for stretching the pre-stretch film is appropriately adjusted so that the properties as the ¼ wave plate are exhibited. The stretching ratio is preferably 1.1 times or more, more preferably 1.2 times or more, and particularly preferably 1.5 times or more, and is preferably 20 times or less, more preferably 10 times or less, and particularly preferably 5 times or less. Herein, when the stretching is performed in a plurality of different directions such as in the case of the biaxial stretching method, the stretching ratio means a total stretching ratio that is represented by product of stretching ratios in the respective stretching directions. When the stretching ratio is equal to or less than the upper limit value of the aforementioned ranges, a possibility of breaking the film can be reduced. Therefore, the ¼ wave plate can be easily produced.

5.3. Step (iv)

It is preferable to perform the crystallization promoting step of the step (iv) after the step (iii). By promoting crystallization, a phase difference film having desired properties for constituting the multilayer film according to the present invention can be obtained.

The promotion of crystallization may be performed by adjusting the stretched film to a specific temperature. The temperature range for promoting crystallization may be optionally set within the temperature range of equal to or higher than the glass transition temperature Tg of the polymer A and equal to or lower than the melting point Tm of the polymer A. In particular, the temperature range is preferably set so that the speed of crystallization increases. Specifically, the temperature range is preferably Tg+20° C. or higher, and more preferably Tg+30° C. or higher, and is preferably Tm−20° C. or lower, and more preferably Tm−40° C. or lower. When the temperature for promoting crystallization is equal to or higher than the lower limit value of the aforementioned ranges, crystallization can be effectively promoted. When the temperature is equal to or lower than the upper limit value, opacity of the ¼ wave plate can be suppressed.

For adjusting the temperature of the stretched film to the aforementioned temperature, the stretched film is usually heated. As a heating device used at this time, a heating device for increasing the atmospheric temperature of the stretched film is preferable. Specific examples of a suitable heating device may include an oven and a heating furnace. Since such heating devices are not required to be brought into contact with the stretched film in heating, uniform heating can be performed.

Promotion of crystallization is preferably performed in a state in which the shape of the stretched film is held and strained. This can inhibit deformation of the stretched film due to thermal shrinkage during the promotion of crystallization. Accordingly, crystallization of the polymer in the stretched film can be promoted without damaging smoothness of the stretched film. Here, the state in which the stretched film is strained refers to a state in which tension is applied to the stretched film. However, the state in which the stretched film is strained does not include a state in which the stretched film is substantially stretched. The state in which the stretched film is substantially stretched refers to the state wherein the stretching ratio in one direction of the stretched film becomes usually 1.1 times or more.

For holding the stretched film, the stretched film is held by appropriate holders. The holders may be those that can continuously hold the stretched film, or may intermittently hold the stretched film at intervals. For example, the stretched film may intermittently be held at intervals by holders spaced apart from each other at a specific distance.

The stretched film may be brought into a strained state by, for example, being held at two or more sides thereof. This prevents deformation of the stretched film due to thermal shrinkage in the region being held and strained. In order to prevent deformation in a wider area of the stretched film, it is preferable that the stretched film is held at sides including two opposing sides so that the region between the held sides is brought into a strained state. For example with regard to a stretched film in a rectangular sheet piece shape, the stretched film is held at two opposing sides (for example, opposing long sides or opposing short sides) so that the region between the two sides is brought into a strained state, thereby preventing deformation on the entire surface of the stretched film in a sheet piece shape. For example with regard to a long-length stretched film, the stretched film are held at two sides on the ends in the width direction (that is, two long sides) so that the region between the two sides is brought into a strained state, thereby preventing deformation on the entire surface of the long-length stretched film. In the stretched film which is prevented from deforming in this manner, occurrence of deformation such as wrinkles can be suppressed even when stress is generated in the film due to thermal shrinkage. In particular, deformation is effectively suppressed when, for example, the stretched film is held at sides including two sides orthogonal to the stretching direction (the direction having a large stretching ratio in biaxial stretching) so that tension is applied in the stretching direction to strain the stretched film.

In order to effectively suppress the deformation due to the promotion of crystallization, the stretched film is preferably held at more sides. Therefore, for example, a stretched film in a sheet piece shape is preferably held at all sides of the film. Specifically, a stretched film in a sheet piece shape is preferably held at four sides.

It is preferable that the holder capable of holding a side of the stretched film is a holder that does not come into contact with a portion other than the sides of the stretched film. By using such a holder, the ¼ wave plate having more excellent smoothness can be obtained.

Also, as the holder, a holder capable of fixing the relative position between holders in the crystallization promoting step is preferable. With such a holder, the relative position between holders does not move in the crystallization promoting step. Therefore, substantial stretching and shrinkage of the stretched film are easily suppressed.

Suitable examples of such a holder for the rectangular stretched film may include grippers such as clips which are disposed to a mold frame at a specific distance and can grip a side of the stretched film. Another example of a holder for holding two sides on the ends in the width direction of the long-length stretched film may be a gripper which is provided to a tenter stretching machine and can grip a side of the stretched film.

Although the long-length stretched film may be held at sides on the ends in the lengthwise direction of the stretched film (that is, short sides), it may also be held at, instead of the short sides, both sides in the lengthwise direction of a treatment region in which the temperature of the stretched film is to be adjusted to a specific temperature for promoting crystallization. For example, a holding device capable of holding and keeping the stretched film in a strained stated for preventing thermal shrinkage may be disposed at both sides in the lengthwise direction of the treatment region of the stretched film. Examples of such a holding device may include a combination of two rolls and a combination of an extruder and a wind-up roll. With these combinations, tension such as conveyance tension is applied to the stretched film. Accordingly, thermal shrinkage of the stretched film can be suppressed in the treatment region where promotion of crystallization is performed. Therefore, when the combinations are used as a holding device, the stretched film can be held while conveying the stretched film in the lengthwise direction. Thus, the ¼ wave plate can be efficiently produced.

Furthermore, the crystallization promoting step eliminates stress in a film which can cause size change of the film under high temperature environments. This enables production of the ¼ wave plate having reduced thermal expansion and thermal size change ratios.

The treatment time for maintaining the stretched film at a specific temperature for promoting crystallization is preferably 1 second or more, and more preferably 5 seconds or more, and is preferably 30 minutes or less, and more preferably 10 minutes or less. When the treatment time is equal to or more than the lower limit value of the aforementioned ranges, crystallization of the polymer contained in the stretched film can sufficiently proceed, so that the thermal resistance of the ¼ wave plate is effectively enhanced. When the treatment time is equal to or less than the upper limit value of the aforementioned ranges, opacity of the ¼ wave plate can be suppressed.

5.4. Step (iii)

After the step (ii), the step (iv) is performed as necessary, and the step (iii) is thereafter performed for removing residual stress from the stretched film.

Relaxation of the strain of the stretched film refers to an action of releasing the stretched film from the state of being held and strained by the stretching machine or the holding device for stretching or promoting crystallization. The stretched film may be held by the holding device as long as the stretched film is not strained. When strain is relaxed in this manner, the stretched film becomes in a state of causing thermal shrinkage. In the relaxing step, the stretched film is allowed to cause thermal shrunkage to thereby eliminate stress which can be generated in the ¼ wave plate during heating. Accordingly, the thermal shrinkage of the ¼ wave plate under high temperature environments can be reduced. Thus, the ¼ wave plate having excellent size stability under high temperature environments can be obtained.

The relaxation of the strain of the stretched film may be performed at once, or may be performed in a continuous or stepwise manner over a period of time.

However, the relaxation of strain is preferably performed in a continuous or stepwise manner in order to suppress occurrence of deformation such as rippling and wrinkles of the obtained ¼ wave plate.

The relaxation of the strain of the stretched film is performed while maintaining the stretched film flat. As described herein, maintaining the stretched film flat refers to maintaining the stretched film in a planar shape so that deformation such as rippling and wrinkles of the stretched film is not caused. This can suppress occurrence of deformation such as rippling and wrinkles of the obtained ¼ wave plate.

The treatment temperature of the stretched film during the relaxation of strain may be set within the temperature range of equal to or higher than the glass transition temperature Tg of the polymer A and equal to or lower than the melting point Tm of the polymer A. Specifically, the treatment temperature is preferably Tg+20° C. or higher, and more preferably Tg+30° C. or higher, and is preferably Tm−20° C. or lower, and more preferably Tm−40° C. or lower. When the relaxing step is performed after the crystallization promoting step without cooling step therebetween, the treatment temperature of the stretched film in the relaxing step is preferably the same as the temperature in the crystallization promoting step. This can suppress unevenness in temperature of the stretched film in the relaxing step, and enhance productivity of the ¼ wave plate.

The treatment time during which the stretched film is maintained within the aforementioned temperature range in the relaxing step is preferably 1 second or more, and more preferably 5 seconds or more, and is preferably 10 minutes or less. When the treatment time is equal to or more than the lower limit value of the aforementioned ranges, size stability of the ¼ wave plate under high temperature environments can be effectively enhanced. When the treatment time is equal to or less than the upper limit value, size stability of the ¼ wave plate under high temperature environments can be effectively enhanced, and opacity of the ¼ wave plate due to the proceeding of crystallization in the relaxing step can also be suppressed.

When the stretched film to be subjected to relaxing of the strain in the relaxing step is a stretched film of a sheet piece shape, there may be adopted, for example, a method of narrowing the distance between the held portions in a continuous or stepwise manner while holding four sides of the stretched film. In this case, the distance between the held portions at four sides of the stretched film may be simultaneously narrowed.

Alternatively, after the distance between the held portions has been narrowed at one or some of the sides, the distance between the held portions may be narrowed at another or others of the sides. Furthermore, the distance between the held portions at one or some of the sides may be retained without being narrowed. Alternatively, the distance between the held portions at one or some of the sides may be narrowed in a continuous or stepwise manner, while the distance between the held portions at another or others of the sides may be narrowed at once.

When the stretched film to be subjected to relaxing of the strain in the relaxing step is a long-length stretched film, there may be adopted, for example, a method of using a tenter stretching machine to narrow the distance between guide rails capable of guiding clips in the conveyance direction of the stretched film or to narrow the distance between adjacent clips.

As previously described, when relaxing of the strain of the stretched film is performed by narrowing the distance between the held portions while keeping the state of holding the stretched film, the degree to which the distance is narrowed may be set depending on the magnitude of the stress remaining in the stretched film. The degree to which the held distance is narrowed in the relaxing step is specifically as follows. That is, when S (%) is the thermal shrinkage in a case in which tension is not applied to the stretched film at the treatment temperature in the relaxing step, the narrowing degree is preferably 0.1 S or more, more preferably 0.5 S or more, and particularly preferably 0.7 S or more, and is preferably 1.2 S or less, more preferably 1.0 S or less, and particularly preferably 0.95 S or less. When the thermal shrinkage S has anisotropy as in a case in which the thermal shrinkage S differs between two directions orthogonal to each other, the degree to which the held distance is narrowed may be defined for each direction within the aforementioned ranges. When the narrowing degree is defined to be within such a range, the residual stress of the ¼ wave plate can be sufficiently removed, and flatness can be maintained as well.

The thermal shrinkage S may be measured by the following method.

A stretched film is cut out at the room temperature 23° C. to provide a sample film of a square shape having size of 150 mm×150 mm. This sample film is heated in an oven set at the same temperature as the treatment temperature in the relaxing step for 60 minutes, and cooled down to 23° C. (room temperature). After that, the lengths of two sides parallel to the direction in which the thermal shrinkage S of the sample film is to be calculated are measured.

On the basis of the measured length of each of the two sides, the thermal shrinkage S of the sample film is calculated according to the following equation (A). In the equation (A), $L_1$ stands for the length of one of the measured two sides of the sample film after heating, and $L_2$ stands for the length of the other.

Thermal shrinkage $S$ (%)=$[(300-L_1-L_2)/300] \times 100$     (A)

6. Method for Producing Other Layers of Phase Difference Film

Layers other than the layer of the resin A, among the layers constituting the phase difference film, may be produced by any methods such as known methods. For example, the ½ wave plate may be produced by stretching a film including the resin containing the alicyclic structure-containing polymer in such a manner that a desired phase difference is exhibited.

7. Barrier Layer

In the multilayer film according to the present invention, the barrier layer is a layer directly provided onto the layer of the resin A on the surface of the phase difference film.

The barrier layer may be an organic barrier layer that contains an organic material or an inorganic barrier layer that contains an inorganic material, or a barrier layer containing the combination thereof. The barrier layer may be a layer having a single layer structure including one layer alone, or a layer of a multilayer structure including two or more layers. For example, the barrier layer may be a layer of a multilayer structure including an organic barrier layer and an inorganic barrier layer alternately in its thickness direction.

In the present application, the barrier layer is preferably a layer containing one or more inorganic barrier layers. Specifically, it is preferable that the barrier layer is constituted of a single inorganic layer alone, of two or more inorganic barrier layers, or of a combination of an inorganic barrier layer and an organic barrier layer. In general, when a multilayer film includes one or more inorganic barrier layers, the film may exhibit a favorable barrier performance, although the film made of resin may possible be deformed by the conditions for forming the barrier layers. In the present application, however, such a deformation can be reduced by adopting a particular film as the phase difference film as described above.

Examples of the organic material that may be contained in the organic barrier layer may include resins containing a polymer having a gas barrier property, such as polyvinyl alcohol, an ethylene-vinyl alcohol copolymer, and vinylidene chloride. One type thereof may be solely used, and two or more types thereof may also be used in combination at any ratio.

Such an organic barrier layer may be formed by a method including, for example, applying a resin solution containing a gas-barrier polymer and a solvent onto a phase difference film, and drying it. Alternatively, the organic barrier layer may be formed by a method including, for example, forming a film containing a monomer of the gas-barrier polymer on a phase difference film, and polymerizing the monomer in this film.

Examples of the inorganic material that may be contained in the inorganic barrier layer may include an inorganic oxide. Examples of the inorganic oxide may include a metal oxide, a non-metal oxide, and a semi-metal oxide. Specific examples thereof may include aluminum oxide, zinc oxide, antimony oxide, indium oxide, calcium oxide, cadmium oxide, silver oxide, auric oxide, chromium oxide, silicon oxide, cobalt oxide, zirconium oxide, tin oxide, titanium oxide, iron oxide, copper oxide, nickel oxide, platinum oxide, palladium oxide, bismuth oxide, magnesium oxide, manganese oxide, molybdenum oxide, vanadium oxide, and barium oxide. Among these, silicon oxide is particularly preferable. One type thereof may be solely used, and two or more types thereof may also be used in combination at any ratio. As the inorganic material, various additives may be used in combination with the aforementioned inorganic oxide. Example thereof may include metal, nonmetal, semimetal, and hydroxides of these; and carbon or fluorine for improving flexibility.

The inorganic barrier layer may be formed by a method of vapor-depositing an inorganic oxide onto a substrate film. Examples of the vapor-deposition method may include a vacuum deposition method, a vacuum sputtering method, an ion plating method, and a CVD method.

Figure 2:
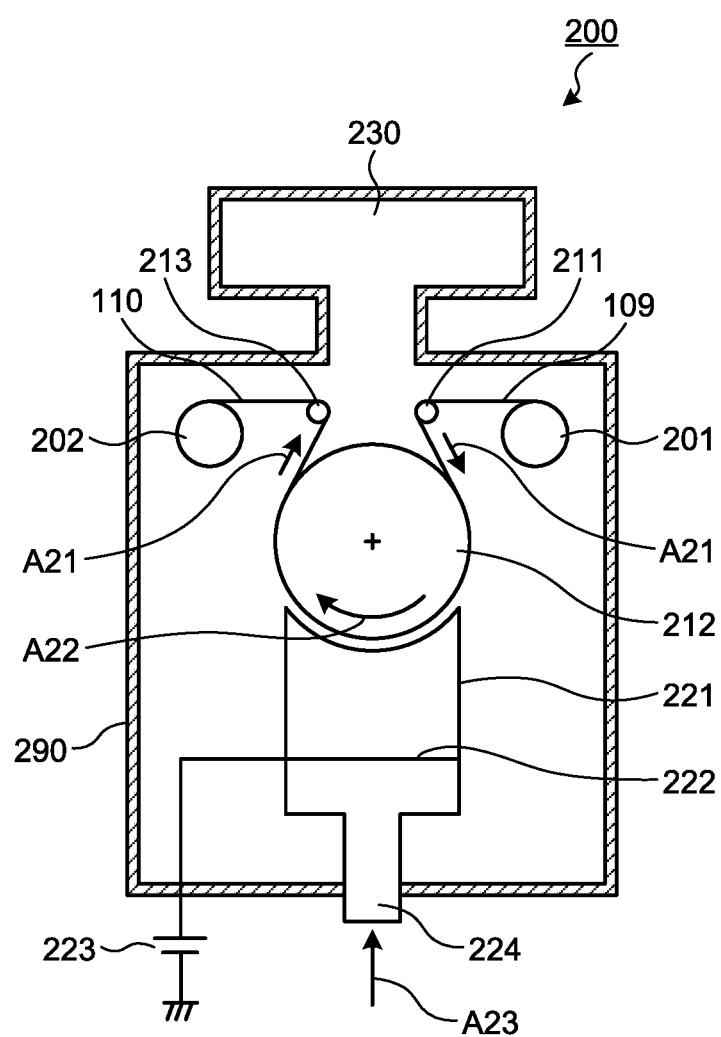
FIG. 2 is a cross-sectional view illustrating an example of an apparatus of forming an inorganic barrier layer by CVD in order to produce the multilayer film according to the present invention illustrated in FIG. 1.

More specific examples of the method for forming the inorganic barrier layer will be described with reference to an example of an apparatus that performs the method. FIG. 2 is a cross-sectional view illustrating an example of an apparatus for forming an inorganic barrier layer by CVD in order to produce the multilayer film according to the present invention illustrated in FIG. 1. In FIG. 2, a film forming apparatus 200 is a plasma CVD apparatus of a film-winding type. The film forming apparatus 200 performs a series of operations including continuously forming an inorganic barrier layer by CVD on a long-length phase difference film 109 having been unwound from a roll body 201 of the phase difference film 109 to form a multilayer film 110, and winding the multilayer film 110 as a roll body 202.

The film forming apparatus 200 includes a guide roll 211, a can roll 212, and a guide roll 213. These rolls can guide the unwound phase difference film 109 in a direction indicated by an arrow A21 to subject the film 109 to production steps. The positions of the guide roll 211, the can roll 212, and the guide roll 213 and tensions to be applied to the phase difference film 109 by these rolls are appropriately adjusted, so that the phase difference film 109 is kept in close contact with the can roll 212 during the guiding by the can roll 212.

The can roll 212 rotates in a direction indicated by an arrow A22, and the phase difference film 109 on the can roll 212 is conveyed while the phase difference film 109 is positioned near a reaction tube 221. At that time, electricity is applied to an electrode 222 from a power supply 223 while the can roll 212 is grounded by an appropriate ground device (not illustrated), and a material gas for the inorganic barrier layer is introduced from a gas inlet 224 in a direction of an arrow A23. By these operations, the inorganic barrier layer can be continuously formed on the surface of the phase difference film 109. The series of operations are performed in a space surrounded by a vacuum chamber 290. The pressure inside the vacuum chamber 290 may be adjusted to a pressure suitable for CVD by operating a vacuum evacuation device 230 to reduce the pressure.

In general in the cases of forming an inorganic barrier layer on a substrate film by these steps, if formation of the inorganic barrier layer is performed with high output power, floating of the substrate film from the can roll is likely to occur. This prevents the continuous formation of the favorable inorganic barrier layer. In particular, when a thin film is used as the substrate film, it is particularly difficult to form the inorganic barrier layer at high speed with high output power without deformation of the substrate film. Herein, by adopting as the phase difference film a combination of the ¼ wave plate serving as the layer of the resin A and the ½ wave plate as an additional layer, the heat resistance of the resin A and the mechanical strength of the additional layer reinforcing the resin A allow the phase difference film to be used as a substrate for continuous formation of the inorganic barrier layer. As a result, the multilayer film having the same function and quality can be easily produced with less number of components than the conventional combination of the phase difference film and a barrier layered body.

The entire thickness of the barrier layer is preferably 1 nm or more, more preferably 5 nm or more, and particularly preferably 10 nm or more, and is preferably 30 or less, more preferably 10 μm or less, and particularly preferably 5 μm or less. When the thickness of the barrier layer is equal to or more than the lower limit value of the aforementioned ranges, the gas barrier performance of the barrier layer can be enhanced. When the thickness is equal to or less than the upper limit value, the thickness of the barrier layer can be made thin.

When a combination of the organic barrier layer and the inorganic barrier layer is provided as the barrier layer, the thicknesses of the organic barrier layer and the inorganic barrier layer are not particularly limited. The thickness of each of the barrier layers is preferably 5 nm to 1,000 nm, more preferably 10 nm to 1,000 nm, and particularly preferably 10 nm to 200 nm. When the thickness of each of the barrier layers is equal to or more than the lower limit value of the aforementioned ranges, the film can be prevented from being distributed in an island shape, so that the water vapor barrier property can be improved. When the thickness is equal to or less than the upper limit value, crack due to bending stress can be suppressed, thereby also improving the water vapor barrier property. In particular, when the thickness of the organic barrier layer is equal to or more than the lower limit value of the aforementioned ranges, uniformity of the thickness can be easily improved. As a result, the organic barrier layer can efficiently embed the structural defects of the inorganic barrier layer, thereby easily improving the barrier properties. When the thickness of the organic barrier layer is equal to or less than the upper limit value of the aforementioned ranges, crack on the organic barrier layer due to external force such as bending can be prevented from occurring, thereby suppressing the reduction in barrier properties.

6. Method for Producing Multilayer Film

The method for producing the multilayer film according to the present invention is not particularly limited, and the multilayer film may be appropriately produced by a production method that is a combination of known techniques. In the case of producing the multilayer film according to the present invention wherein the phase difference film includes a ¼ wave plate as the layer of the resin A and further a ½ wave plate, such a multilayer film can be produced by a production method including the following steps (a) and (b):

Step (a): a step of bonding a ½ wave plate and a ¼ wave plate via an adhesive to form a phase difference film including these wave plates; and Step (b): a step of forming a barrier layer directly on the surface of the phase difference film on the side of the ¼ wave plate.

As the specific operation of the step (a) and the adhesive used in the step (a), those described in the above description may be used. The step (b) may be performed by the method for forming the barrier layer as described above, for example.

9. Properties of Multilayer Film

The multilayer film according to the present invention may preferably have a low water vapor permeability. Specifically, the water vapor permeability is preferably 0.01 g/(m²·day) or lower, more preferably 0.005 g/(m²·day) or lower, and further preferably 0.003 g/(m²·day) or lower. The lower limit of the water vapor permeability is not particularly limited, but ideally zero g/(m²·day). The multilayer film with the low water vapor permeability can effectively prevent deterioration of layers, such as a light emitting layer in an organic electroluminescent display device as well as preventing generation of dark spots in the display device. Such a lower water vapor permeability may be achieved by appropriately selecting materials of the layers constituting the multilayer film, such as the barrier layer. The water vapor permeability may be measured using a water vapor permeability measuring device (product name: "PERMATRON-W" manufactured by MOCON) under the conditions of 40° C. in temperature and 90% RH in accordance with JIS K 7129 B-1992.

The in-plane retardation Re of the multilayer film according to the present invention, as a value measured with light having a wavelength of 590 nm at 23° C., is preferably 140 nm or more, and more preferably 145 nm or more, and is preferably 155 nm or less, and more preferably 150 nm or less. The in-plane retardation Re of the multilayer film, as a value measured with light having a wavelength of 450 nm at 23° C., is preferably 108 nm or more, and more preferably 110 nm or more, and is preferably 115 nm or less, and more preferably 113 nm or less. The in-plane retardation Re of the multilayer film, as a value measured with light having a wavelength of 650 nm at 23° C., is preferably 158 nm or more, and more preferably 160 nm or more, and is preferably 168 nm or less, and more preferably 165 nm or less. When the multilayer film according to the present invention has such in-plane retardations Re, the multilayer film can favorably exhibit functions, such as antireflection, in an organic electroluminescent display device.

10. Use Application of Multilayer Film

The multilayer film according to the present invention is a multilayer film for use in an organic electroluminescent display device. Specifically, the multilayer film may be used in various use applications by taking advantages of the barrier performance and optical properties of the multilayer film. Preferable examples of the use application may include the use applications as a circularly polarizing plate and an antireflective film described below.

11. Circularly Polarizing Plate

The circularly polarizing plate according to the present invention includes the multilayer film according to the present invention and a linear polarizer disposed on a surface of the multilayer film opposite to the barrier layer.

As the linear polarizer, there may be used known polarizers used in devices such as an organic electroluminescent display device, a liquid crystal display device, and other optical devices. Examples of the linear polarizer may include: a product obtained by effecting absorption of iodine or a dichroic dye into a polyvinyl alcohol film, and thereafter uniaxially stretching the film in a boric acid bath; and a product obtained by effecting absorption of iodine or a dichroic dye into a polyvinyl alcohol film, stretching the film, and further modifying some of polyvinyl alcohol units in the molecular chain into polyvinylene units. Other examples of the linear polarizer may include a polarizer having a function of separating polarized light into reflected light and transmitted light, such as a grid polarizer, a multi-layered polarizer, and a cholesteric liquid crystal polarizer. Among these, a polarizer containing polyvinyl alcohol is preferable. As the linear polarizer, there may also be used a commercially available product (for example, trade name "HLC2-5618S", "LLC2-9218S", and "HLC2-2518" manufactured by Sanritz Corporation, and trade name "TEG1465DU", "SEG1423DU", and "SEG5425DU" manufactured by Nitto Denko Corporation).

When natural light enters the polarizer used in the present invention, only one polarized light passes through the polarizer. The polarization degree of the polarizer used in the present invention is not particularly limited, but is preferably 98% or more, and more preferably 99% or more. The average thickness of the polarizer is preferably 5 to 80 µm.

The circularly polarizing plate according to the present invention is preferably produced by bonding the long-length multilayer film and the long-length linear polarizer by a roll-to-roll process in such a manner that their lengthwise directions are aligned in parallel with each other. Bonding by the roll-to-roll process refers to bonding in a manner wherein a film is unwound from a roll of the long-length film, the unwound film is conveyed, a step of bonding the film with another film on the conveyance line is performed, and the obtained bonded product is taken up to form a roll. For example, when the linear polarizer and the multilayer film are bonded to each other, the bonding of the roll-to-roll process may be performed by unwinding the multilayer film from a roll of the long-length multilayer film, conveying the unwound film, performing a step of bonding the film with the linear polarizer on the conveyance line, and taking up the obtained bonded product to form a roll. In this case, the linear polarizer may also be unwound from a roll to be supplied to the step of bonding. As the linear polarizer to be bonded with the multilayer film, a linear polarizer having a multilayer structure in which it is previously bonded to a polarizer protective film may be used and bonded.

It is preferable that the circularly polarizing plate according to the present invention has another polarizer protective film bonded onto the surface of the linear polarizer on which the multilayer film is not bonded. The multilayer film according to the present invention and the polarizer protective film both have a stiffness of preferably 300 kPa·m or less and a curvature of 10 mm or more and 50 mm or less. As described herein, stiffness is a value calculated as the product of a film tensile modulus (Pa) and a film thickness (m). It is further preferable that the difference in stiffness between the protective films on both surfaces of the linear polarizer (that is, the multilayer film according to the present invention disposed on one surface side of the linear polarizer, and the polarizer protective film on the other surface side) is 20 to 200 kPa·m. Examples of the polarizer protective film which may be used in combination with the multilayer film according to the present invention may include ZEONOR Film manufactured by ZEON Corporation, a TAC film for liquid crystal polarizing plates manufactured by Konica Minolta Inc., and Fujitac manufactured by Fujifilm Corporation. The polarizer protective film may be either a single-layer film or a multi-layered film. Since the multilayer film according to the present invention has bendable properties, a flexible polarizing plate having a protective film on both surfaces of the polarizer is obtained. Thus, a display device having a curved surface can be provided. The display device having a curved surface is, for example, excellent in decoration and design. When a liquid crystal display device is a portable device such as a smartphone, it can be firmly held by the palm.

12. Antireflective Film

The antireflective film according to the present invention includes the circularly polarizing plate according to the present invention described above. The antireflective film according to the present invention may include any optional component, such as a polarizer protective film, in addition to the circularly polarizing plate, but may be constituted of the circularly polarizing plate alone.

The antireflective film according to the present invention includes the linear polarizer, the ½ wave plate, the ¼ wave plate serving as the layer of the resin A, and the barrier layer in this order. In the antireflective film according to the present invention, the angle formed between the polarizing transmission axis of the linear polarizer and the slow axis of the ½ wave plate is 10° or more and 20° or less, or 70° or more and 80° or less. When the antireflective film having such an angular relationship is disposed onto the display surface of an organic electroluminescent display device, glare and outside light reflections on the display surface can be effectively suppressed.

In a certain product and its components according to the present invention (the phase difference film, the multilayer film, the circularly polarizing plate, the antireflective film, the display device, and the like), the angular relationship among the directions of the in-plane optical axes (slow axis, transmission axis, transmission axis, and the like) and the geometric directions (lengthwise direction and width direction of a film, and the like) is defined with the shift in one direction being positive and the shift in the other direction being negative. The positive and negative directions are defined in common among all components in the product. For example, with regard to a certain circularly polarizing plate, the statement "the slow axis direction of the ½ wave plate relative to the transmission axis direction of the linear polarizer is 15°, and the slow axis direction of the ¼ wave plate relative to the transmission axis direction of the linear polarizer is 75°" indicates the following two cases:

when the circularly polarizing plate is observed from one surface thereof, the slow axis direction of the ½ wave plate shifts by 15° clockwise from the transmission axis direction of the linear polarizer, and the slow axis direction of the ¼ wave plate shifts by 75° clockwise from the transmission axis direction of the linear polarizer; and when the circularly polarizing plate is observed from one surface thereof, the slow axis direction of the ½ wave plate shifts by 15° counterclockwise from the transmission axis direction of the linear polarizer, and the slow axis direction of the ¼ wave plate shifts by 75° counterclockwise form the transmission axis direction of the linear polarizer.

Preferable examples of the antireflective film according to the present invention may include the following Examples (A) and (B). When the configuration of Example (A) or Example (B) is adopted, glare and outside light reflections on the display surface of an organic electroluminescent display device can be further effectively suppressed.

Example (A): The slow axis direction of the ½ wave plate relative to the transmission axis direction of the linear polarizer is approximately 15°, and the slow axis direction of the ¼ wave plate relative to the transmission axis direction of the linear polarizer is approximately 75°.

Example (B): The slow axis direction of the ½ wave plate relative to the transmission axis direction of the linear polarizer is approximately 75°, and the slow axis direction of the ¼ wave plate relative to the transmission axis direction of the linear polarizer is approximately 15°.

In the present application, "approximately 15°" is an angle of 15° or around 15°, preferably 10 to 20°, more preferably 11 to 19°, and further more preferably 12 to 18°. "Approximately 75°" is an angle of 75° or around 75°, preferably 70 to 80°, more preferably 71 to 79°, and further more preferably 72 to 78°.

In the antireflective film according to the present invention, the ratio $R_0/R_{10(0\ deg)}$ of the reflectivity $R_0$ at an incident angle of 0° relative to the reflectivity $R_{10(0\ deg)}$ at an incident angle of 10° at an azimuth angle of 0°, and the ratio $R_0/R_{10(180\ deg)}$ of the reflectivity $R_0$ at an incident angle of 0° relative to the reflectivity $R_{10(180\ deg)}$ at an incident angle of 10° at an azimuth angle of 180° are both 0.95 or more. The reflectivity $R_0$, reflectivity $R_{10(0\ deg)}$, and reflectivity $R_{10(180\ deg)}$ may be measured using a V7200 spectrophotometer and a VAP7020 absolute reflectivity unit (manufactured by Jasco Corporation). With such reflectivity ratios, highly uniform antireflective effects can be obtained in both the front direction and the oblique direction at azimuth angles of 0° and 180°. In particular, excellent effects can be obtained in the display device having a curved surface. The antireflective film having such reflectivity ratios may be obtained by reducing the thickness of the members constituting the antireflective film and selecting flexible members. The direction which serves as the reference of the azimuth angle (an azimuth angle of 0°) in the measurement of the reflectivity $R_{10(0\ deg)}$ and reflectivity $R_{10(180\ deg)}$ may be an arbitrary direction in the plane of the film. That is, if $R_0$, $R_{10(0\ deg)}$ and $R_{10(180\ deg)}$ satisfy the aforementioned requirement when any one direction in a plane of a certain antireflective film is defined as the reference of the azimuth angle, the antireflective film can be regarded as a film satisfying this requirement as to the reflectivity. It is particularly preferable that the requirement is satisfied when the absorption axis direction of the linear polarizer is the reference.

13. Organic Electroluminescent Display Device

The organic electroluminescent display device according to the present invention includes the antireflective film according to the present invention.

Figure 3:
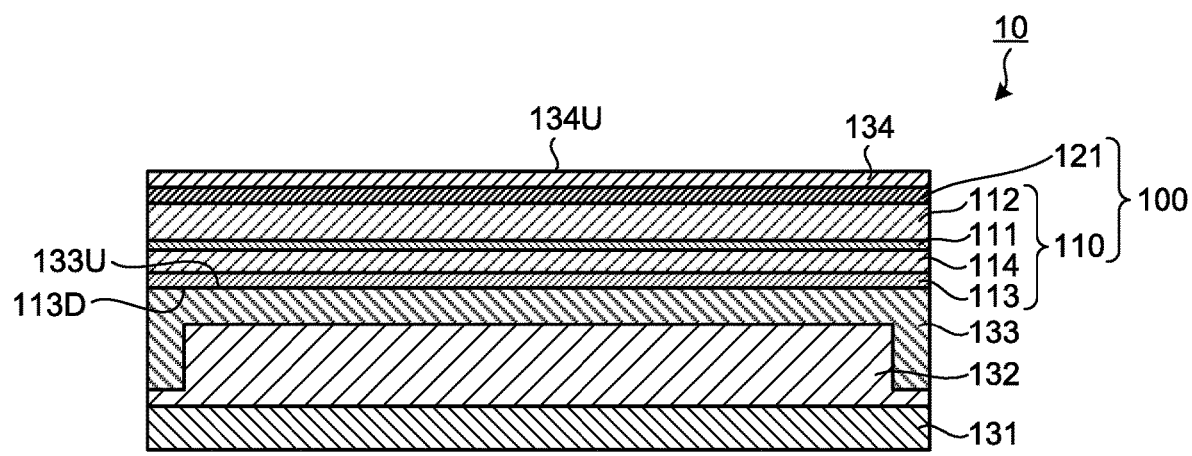
FIG. 3 is a cross-sectional view schematically illustrating an example of an organic electroluminescent display device according to the present invention.

FIG. 3 is a cross-sectional view schematically illustrating an example of the organic electroluminescent display device according to the present invention. In FIG. 3, an organic electroluminescent display device 10 includes a substrate plate 131, a light-emitting element 132 formed on the substrate plate 131, and a sealing material layer 133 which seals the light-emitting element 132. The light-emitting element 132 includes an electrode for applying electricity, a light-emitting layer containing a light-emitting material capable of emitting light by the application of the electricity, and other components (all of them are not illustrated). An antireflective film 100 according to the present invention is disposed onto a top surface 133U of the sealing material layer 133. The antireflective film 100 includes the multilayer film 110 according to the present invention illustrated in FIG. 1, and a linear polarizer 121 disposed onto the surface on the top side (a ½ wave plate 112 side) of the multilayer film 110. The antireflective film 100 is in contact with the sealing material layer 133 at a surface 113D on the lower side (a barrier layer 113 side) of the antireflective film 100. The organic electroluminescent display device 10 further includes onto the surface on the top side of the antireflective film 100 a protective film 134 which protects the linear polarizer 121. In the organic electroluminescent display device 10, a surface 134U on the top side of the protective film 134 serves as a light emission surface through which light emits from the inside to the outside of the device. When the sealing material layer 133 has tackiness, for example, the barrier layer 113 and the sealing material layer 133 may be bonded to each other not via an adhesive layer or the like but directly. However, an adhesive layer placed between the barrier layer 113 and the sealing material layer 133 for bonding may be further provided as necessary. An adhesive layer which bonds the linear polarizer 121 and the protective film 134 may also be further provided therebetween as necessary. The adhesive layer is not particularly limited, and may be, for example, an adhesive layer that is the same as the adhesive layer 111 placed between the ¼ wave plate 114 and the ½ wave plate 112.

In the organic electroluminescent display device 10, part of outside light entering the display surface 134U from the outside of the device may be reflected by a component such as the light-emitting element 132 in the device, and exit from the display surface 134U. Such reflected light is recognized as glare or outside light reflections by an observer. Since the organic electroluminescent display device 10 according to the present invention includes the antireflective film 100 according to the present invention, such glare and outside light reflections can be suppressed. Specifically, only linearly polarized light, which is part of the light entering from the outside of the device, passes through the polarizing plate, and then passes through the phase difference film, thereby being transformed into circularly polarized light. The circularly polarized light is reflected by a component which reflects light in the display device, and passes through the phase difference film again, thereby being transformed into linearly polarized light having its polarizing axis in a direction which is not parallel to the polarizing axis of the linearly polarized light having entered. As a result, the reflected light which exits to the outside of the device decreases. Thus, the function of antireflection is achieved.

EXAMPLES

Hereinafter, the present invention will be specifically described by illustrating Examples. However, the present invention is not limited to the Examples described below.

The present invention may be optionally modified and implemented without departing from the scope of claims of the present invention and its equivalents.

In the following description, "%" and "part" representing quantity are on the basis of weight, unless otherwise specified. The operation described later was performed under the conditions of normal temperature and normal pressure in atmospheric air, unless otherwise specified.

When the film is wound to form a roll in the following operation, the film to be wound was bonded to a masking film (for example, FF1025 manufactured by Tredegar Corporation) as necessary so that winding was performed in a state in which the surface is protected. Then, when the film is used, the masking film was peeled off in an appropriate stage of the operation.

In the following description, "sccm" is the unit for a flow rate of a gas, and the amount of the gas flowing per minute is indicated by a volume ($cm^3$) when the gas is at 25° C. and 1 atm.

Evaluation Methods (Photoelastic Coefficient)

For measuring the photoelastic coefficient, the retardation in a plane of the film was measured while applying a load of 50 to 150 g to the film using a retardation measuring device ("KOBRA-21ADH" manufactured by Oji Scientific Instruments). The measured retardation was divided by the thickness of the film to obtain a birefringence value $\Delta n$, and the $\Delta n$ was obtained by varying the load. Then, a load–$\Delta n$ curve was created, and the photoelastic coefficient was obtained from the tilt of the curve.

(Thermal Size Change Ratio)

A film was cut out at the room temperature 23° C. to provide a sample film of a square shape having a size of 150 mm×150 mm. This sample film was heated in an oven at 150° C. for 60 minutes, and cooled down to 23° C. (room temperature). After that, the lengths of the four sides and two diagonals of the sample film were measured.

On the basis of the measured length of each of the four sides, the thermal size change ratio of the sample film was calculated according to the following equation (I). In the equation (I), LA stands for the length of a side of the sample film after heating.

$$\text{Thermal size change ratio (\%)} = [(LA-150)/150] \times 100 \quad (I)$$

On the basis of the measured lengths of the two diagonals, the thermal size change ratio of the sample film was calculated according to the following equation (II). In the equation (II), LD stands for the length of each of the diagonals of the sample film after heating.

$$\text{Thermal size change ratio (\%)} = [(LD-212.13)/212.13] \times 100 \quad (II)$$

The value having the maximum absolute value among the six calculated values of the thermal size change ratios was adopted as the thermal size change ratio of the film.

(Water Vapor Permeability of Multilayer Film)

Using a water vapor permeability measuring device (product name: "PERMATRAN-W", manufactured by MOCON Inc.), the water vapor permeability was measured under the conditions of 40° C. in temperature and 90% RH in accordance with JIS K 7129 B-1992. The detection limit of this measuring device is 0.01 g/($m^2$·day).

(Surface State of Multilayer Film)

The surface states of the multilayer films obtained in Examples and Comparative Examples were visually observed, and evaluated in accordance with the following evaluation criteria.

Good: The film surface is flat or with mere simple curl, without wrinkles and rippling.

Failure: Deformation such as wrinkles and rippling is observed on the film surface.

(Curl Amount of Multilayer Film)

Each of the multilayer films obtained in Examples and Comparative Examples was cut to obtain a 5 cm×5 cm rectangular sample. This sample was placed on a flat stage with the barrier layer side facing downward. The heights of the four corners of the multilayer film, which have lifted from the stage, were measured. The average for the measured heights was adopted as the curl amount. When the sample has been curled up, the height cannot be measured. In such a case, the curl amount was simply evaluated as "failure".

(Adhesion Between Barrier Layer and ¼ Wave Plate in Multilayer Film)

The barrier layer of the obtained multilayer film was subjected to a cross-cut test of 100 pieces of 1-mm squares in accordance with JIS K5400. The peeled state of the barrier layer was observed with cellophane tape (specified in JIS Z1522). In this test, the cellophane tape bonded to the barrier layer side was peeled, and the number of squares of the barrier layer which were not peeled from the resin film was counted. A larger number of the squares of the barrier layer which were not peeled from the ¼ wave plate is indicative of higher adhesion between the barrier layer and the ¼ wave plate.

Production Example 1: Production of Primary Film A

P1-1. Production Steps of Hydrogenated Product of Ring-Opening Polymer of Dicyclopentadiene A metal pressure-resistant reaction vessel was sufficiently dried. After that, the atmosphere in the vessel was replaced with nitrogen. Into this metal pressure-resistant reaction vessel, 154.5 parts of cyclohexane, 42.8 parts (30 parts as the dicyclopentadiene content) of a 70% cyclohexane solution of dicyclopentadiene (endo-isomer content: 99% or more), and 1.9 parts of 1-hexene were charged. The mixture was heated to 53° C.

A solution obtained by dissolving 0.014 parts of a tetrachlorotungsten phenylimide (tetrahydrofuran) complex in 0.70 parts of toluene was prepared. Into this solution, 0.061 parts of a 19% n-hexane solution of diethylaluminum ethoxide was added. The mixture was stirred for 10 minutes to prepare a catalyst solution.

This catalyst solution was added to the pressure-resistant reaction vessel to initiate a ring-opening polymerization reaction. After that, the reaction was performed for 4 hours while maintaining the temperature at 53° C. to obtain a solution of a ring-opening polymer of dicyclopentadiene.

The number-average molecular weight (Mn) and weight-average molecular weight (Mw) of the obtained ring-opening polymer of dicyclopentadiene were 8,750 and 28,100, respectively. The molecular weight distribution (Mw/Mn) calculated from these weights was 3.21.

To 200 parts of the obtained solution of the ring-opening polymer of dicyclopentadiene, 0.037 parts of 1,2-ethanediol was added as a terminator. The mixture was heated to 60° C., and stirred for 1 hour to terminate the polymerization reaction. To the resultant product, 1 part of a hydrotalcite-like compound ("Kyoward (registered trademark) 2000" manufactured by Kyowa Chemical Industry Co., Ltd.) was added. The mixture was heated to 60° C., and stirred for 1 hour. After that, to the obtained product, 0.4 parts of a filter aid ("Radiolite (registered trademark) #1500" manufactured by Showa Chemical Industry Co., Ltd.) was added. The mixture was filtered through a PP pleated cartridge filter ("TCP-HX" manufactured by Advantec Toyo Kaisha Ltd.) to separate the adsorbent and the solution.

To 200 parts (polymer amount: 30 parts) of the filtered ring-opening polymer of dicyclopentadiene, 100 parts of cyclohexane was added. To the mixture, 0.0043 parts of chlorohydridocarbonyl tris(triphenylphosphine) ruthenium was further added. Thus, a hydrogenation reaction was performed at a hydrogen pressure of 6 MPa and 180° C. for 4 hours. Accordingly, a reaction liquid containing a hydrogenated product of the ring-opening polymer of dicyclopentadiene was obtained. In this reaction liquid, the hydrogenated product was deposited. As a result, the reaction liquid had become a slurry solution.

The hydrogenated product and the solution contained in the reaction liquid were separated using a centrifugal separator, and dried under reduced pressure at 60° C. for 24 hours to obtain 28.5 parts of the hydrogenated product of the ring-opening polymer of dicyclopentadiene having crystallizability. This hydrogenated product had a hydrogenation rate of 99% or more, a glass transition temperature Tg of 93° C., a melting point (Tm) of 262° C., and a racemo diad ratio of 89%.

P1-2. Production Steps of Primary Film A

To 100 parts of the hydrogenated product of the ring-opening polymer of dicyclopentadiene obtained in (P1-1), 1.1 parts of an antioxidant (tetrakis[methylene-3-(3',5'-di-t-butyl-4'-hydroxyphenyl)propionate]methane; "Irganox (registered trademark) 1010" manufactured by BASF Japan Ltd.) was added. Thus, a crystallizable resin to serve as a material of the film was obtained.

The crystallizable resin was charged into a twin screw extruder provided with four die holes each having an inner diameter of 3 mm ("TEM-37B" manufactured by Toshiba Machine Co. Ltd.). With the twin screw extruder, the crystallizable resin was molded in a strand shape by hot melt extrusion molding. This molded product was finely cut with a strand cutter to obtain pellets of the crystallizable resin. The operation conditions of the twin screw extruder are as follows.

Barrel set temperature: 270° C. to 280° C.

Die set temperature: 250° C.

Screw rotation speed: 145 rpm

Feeder rotation speed: 50 rpm

Subsequently, the obtained pellets were supplied to a hot-melt extrusion film-molding machine equipped with a T die. Using this film molding machine, the crystallizable resin was molded by a method of winding up the film on a roll at a speed of 26.45 m/min. Accordingly, a long-length primary film A (thickness: 70 μm, width: 750 mm) was produced. The operation conditions of the film-molding machine are as follows.

Barrel temperature setting: 280° C. to 290° C.

Die temperature: 270° C.

Screw rotation speed: 30 rpm

Production Example 2: Production of Primary Film B

Pellets of a thermoplastic norbornene resin (manufactured by ZEON Corporation, glass transition temperature: 126° C.) were dried at 100° C. for 5 hours. The dried pellets were supplied to an extruder, and melted in the extruder. Then, the melted resin was passed through a polymer pipe and a polymer filter, extruded in a sheet-like shape from a T die onto a casting drum, and cooled. Thus, a primary film B with a thickness of 80 μm and a width of 1350 mm was obtained. This primary film B was wound to obtain a film roll.

Production Example 3: Production of ¼ Wave Plate A1

P3-1. Stretching Step

The primary film A produced in Production Example 1 was unwound from the roll, and supplied to a tenter stretching machine. Two sides on the ends in the width direction of the film were gripped with clips of the tenter stretching machine. Then, uniaxial stretching treatment was performed in such an oblique direction that the orientation angle relative to the width direction becomes 45°, with a stretching ratio of 1.8 times, a stretching temperature of 130° C., and a stretching rate of 5 m/min.

P3-2. Crystallization Promoting Step

After the uniaxial stretching treatment of (P3-1), the film was conveyed while the width size at the time point when stretching ended was held with the clips of the stretching machine, so that the strained state of the film was retained. Keeping this state, the film was heated in an oven at 200° C. for 30 seconds to perform a crystallization promoting step which promotes crystallization of the hydrogenated product of the ring-opening polymer of dicyclopentadiene contained in the film. The film after heating treatment was wound on a roll to obtain a ¼ wave plate A1 in a roll shape. This ¼ wave plate A1 had a thickness of 35 μm, an orientation angle relative to the width direction of 45°, an in-plane retardation Re of 136 nm, a photoelastic coefficient at 23° C. of $4 \times 10^{-12}$ $Pa^{-1}$, a birefringence Δn of 0.0039, and a crystallization degree of 21%. The ¼ wave plate A1 had a thermal size change ratio at 150° C. of 0.4%, a melting point of 262° C., and a water absorption of 0.009%.

Production Example 4: Production of ¼ Wave Plate A2

A ¼ wave plate A2 was obtained in the same manner as that of Production Example 3, except that the stretching conditions in (P3-1) were changed such that the stretching ratio was 2.0 times, and the stretching direction was such an oblique direction that the orientation angle relative to the width direction becomes 15° (a stretch temperature of 130° C. and a stretching rate of 5 m/min were not changed).

This ¼ wave plate A2 had a thickness of 30 an orientation angle relative to the width direction of 15°, an in-plane retardation Re of 141 nm, a photoelastic coefficient at 23° C. of $4 \times 10^{-12}$ $Pa^{-1}$, a birefringence Δn of 0.0047, and a crystallization degree of 20%. The ¼ wave plate A2 had a thermal size change ratio at 150° C. of 0.3%, a melting point of 262° C., and a water absorption of 0.009%.

Production Example 5: Production of ½ Wave Plate B1

The primary film B produced in Production Example 2 was unwound from the roll, and supplied to a tenter stretching machine. Then, a uniaxial stretching treatment was performed in such an oblique direction that the orientation angle relative to the width direction becomes 45°, with a stretching ratio of 1.5 times, a stretching temperature of 140° C., and a stretching rate of 10 m/min. The stretched film was wound in a roll shape to obtain an intermediate film. The obtained intermediate film had an orientation angle relative to the width direction of 45° and an in-plane retardation of 190 nm.

Subsequently, the obtained intermediate film was unwound from the roll, and further subjected to a free longitudinal uniaxial stretching. In this stretching, the stretching direction was the lengthwise direction of the film, the stretching ratio was 1.45 times, and the stretching temperature was 122° C. The stretched film was wound to obtain a ½ wave plate B1 in a roll shape.

This ½ wave plate B1 had a thickness of 50 μm, an orientation angle relative to the width direction of 75°, an in-plane retardation Re of 260 nm, a photoelastic coefficient at 23° C. of $6 \times 10^{-12}$ $Pa^{-1}$, and a birefringence Δn of 0.0054. The thermal size change ratio at 150° C. of the ½ wave plate B1 could not be measured, because wrinkles were generated on the entire surface. The melting point could not be observed. The Tg was 126° C., and the water absorption was 0.009%.

Production Example 6: Production of ¼ Wave Plate B2

The primary film B produced in Production Example 2 was unwound from the roll, and supplied to a tenter stretching machine. Then, a uniaxial stretching treatment was performed in such an oblique direction that the orientation angle relative to the width direction becomes 45°, with a stretching ratio of 1.25 times, a stretching temperature of 135° C., and a stretching rate of 10 m/min. The stretched film was wound in a roll shape to obtain an intermediate film. The obtained intermediate film had an orientation angle relative to the width direction of 45° and an in-plane retardation of 140 nm.

Subsequently, the obtained intermediate film was unwound from the roll, and further subjected to a free longitudinal uniaxial stretching. In this stretching, the stretching direction was the lengthwise direction of the film, the stretching ratio was 1.40 times, and the stretching temperature was 133° C. The stretched film was wound to obtain a ¼ wave plate B2 in a roll shape.

This ¼ wave plate B2 had a thickness of 40 μm, an orientation angle relative to the width direction of 75°, an in-plane retardation Re of 130 nm, a photoelastic coefficient at 23° C. of $6 \times 10^{-12}$ $Pa^{-1}$, and a birefringence Δn of 0.0033. The thermal size change ratio at 150° C. of the ¼ wave plate B2 could not be measured, because wrinkles were generated on the entire surface. The melting point could not be observed (that is, being amorphous). The Tg was 126° C., and the water absorption was 0.009%.

Production Example 7: Production of ½ Wave Plate B3

The primary film B produced in Production Example 2 was unwound from the roll, and supplied to a tenter stretch-ing machine. Then, a uniaxial stretching treatment was performed in such an oblique direction that the orientation angle relative to the width direction becomes 15°, with a stretching ratio of 1.50 times, a stretching temperature of 142° C., and a stretching rate of 10 m/min. The stretched film was wound in a roll shape to obtain a ½ wave plate B3.

This ½ wave plate B3 had a thickness of 22 μm, an orientation angle relative to the width direction of 15°, an in-plane retardation Re of 260 nm, a photoelastic coefficient at 23° C. of $6 \times 10^{-12}$ $Pa^{-1}$, and a birefringence Δn of 0.0118. The thermal size change ratio at 150° C. of the ½ wave plate B3 could not be measured, because wrinkles were generated on the entire surface. The melting point could not be observed. The Tg was 126° C., and the water absorption was 0.009%.

Production Example 8: Production of ¼ Wave Plate B4

The primary film B produced in Production Example 2 was unwound from the roll, and supplied to a tenter stretching machine. Then, a uniaxial stretching treatment was performed in such an oblique direction that the orientation angle relative to the width direction becomes 45°, with a stretching ratio of 1.50 times, a stretching temperature of 144° C., and a stretching rate of 10 m/min. The stretched film was wound in a roll shape to obtain a ¼ wave plate B4.

This ¼ wave plate B4 had a thickness of 47 μm, an orientation angle relative to the width direction of 45°, an in-plane retardation Re of 140 nm, a photoelastic coefficient at 23° C. of $6 \times 10^{-12}$ $Pa^{-1}$, and a birefringence Δn of 0.0030. The thermal size change ratio at 150° C. of the ¼ wave plate B4 could not be measured, because wrinkles were generated on the entire surface. The melting point could not be observed. The Tg was 126° C., and the water absorption was 0.009%.

Production Example 9: Production Steps of Primary Film C

A long-length primary film C (thickness: 35 μm, width: 750 mm) was produced in the same manner as that of the production steps of the primary film A in Production Example 1, except that the conditions for the molding by the hot-melt extrusion film molding machine were changed.

Production Example 10: Production of ¼ Wave Plate A3

P10-1. Stretching Step

The primary film C produced in Production Example 9 was unwound from the roll, and supplied to a tenter stretching machine. Two sides on the ends in the width direction of the film were gripped with clips of the tenter stretching machine. Then, uniaxial stretching treatment was performed in such an oblique direction that the orientation angle relative to the width direction becomes 15°, with a stretching ratio of 2.5 times, a stretching temperature of 110° C., and a stretching rate of 5 m/min.

P10-2. Crystallization Promoting Step

After the uniaxial stretching treatment of (P10-1), the film was conveyed while the width size at the time point when stretching ended was held with the clips of the stretching machine, so that the strained state of the film was retained.

Keeping this state, the film was heated in an oven at 200° C. for 30 seconds to perform a crystallization promoting step which promotes crystallization of the hydrogenated product of the ring-opening polymer of dicyclopentadiene contained in the film. The film after heating treatment was wound to obtain a ¼ wave plate A3 in a roll shape. This ¼ wave plate A3 had a thickness of 13 μm, an orientation angle relative to the width direction of 15°, an in-plane retardation Re of 145 nm, a photoelastic coefficient at 23° C. of $4\times10^{-12}$ $Pa^{-1}$, a birefringence Δn of 0.011, and a crystallization degree of 25%. The ¼ wave plate A3 had a thermal size change ratio at 150° C. of 0.6%, a melting point of 262° C., and a water absorption of 0.009%.

Example 1

1-1. Phase Difference Film

The ¼ wave plate A1 produced in Production Example 3 was unwound from the roll, and used as the ¼ wave plate. The ½ wave plate B1 obtained in Production Example 5 was unwound from the roll, and used as the ½ wave plate. These were bonded together via an adhesive layer ("CS9621" manufactured by Nitto Denko Corporation) in such a manner that their lengthwise directions are in parallel with each other. When bonding, the ¼ wave plate A1 was used in a reversed state (that is, the orientation angle relative to the width direction was changed from 45° to 135°). By such reversing, the angle formed between the slow axis of the ¼ wave plate and the slow axis of the ½ wave plate became 60° when viewed from the thickness direction. Thus, a phase difference film (I-1) was obtained.

1-2. Multilayer Film

A barrier layer was formed on the surface on the ¼ wave plate side of the phase difference film (I-1) by a CVD method. The film-forming operation was performed using a film-forming apparatus (a plasma CVD apparatus of a film-winding type) schematically illustrated in FIG. 2. The film was formed by RF plasma discharge under the conditions of a tetramethyl silane (TMS) flow rate of 10 sccm, an oxygen ($O_2$) flow rate of 100 sccm, an output of 0.8 kW, a total pressure of 5 Pa, and a film conveyance rate of 0.5 m/min. As a result, a barrier layer made of SiOx having a thickness of 300 nm was formed. Thus, a multilayer film (I-2) having a layer structure of (½ wave plate)/(tackiness agent layer)/(¼ wave plate)/(barrier layer) was obtained.

1-3. Evaluation of Multilayer Film

The obtained multilayer film was evaluated for its surface state and curl amount as well as adhesion between the barrier layer and the ¼ wave plate.

1-4. Production And Evaluation of Circularly Polarizing Plate

As the linear polarizer, there was prepared a polarizing film ("HLC2-5618S" manufactured by Sanritz Corporation, a long-length polarizer with a thickness of 180 μm having its polarizing transmission axis in the direction of 0° relative to the width direction, the same applies to the following Examples and Comparative Examples). This film was cut to obtain an A4-size rectangular linear polarizer having its polarizing transmission axis in the direction of 60° relative to the long side direction.

The multilayer film (I-2) obtained in (1-2) was cut to obtain an A4-size rectangular film. The cutting was performed in such a manner that the width direction of the multilayer film (I-2) becomes the long side direction of the rectangular film. The surface on the ½ wave plate side of this rectangular film was bonded to the rectangular linear polarizer via a layer of a tackiness agent ("CS9621" manufactured by Nitto Denko Corporation). Accordingly, a circularly polarizing plate having a layer structure of (linear polarizer)/(tackiness agent layer)/(½ wave plate)/(tackiness agent layer)/(¼ wave plate)/(barrier layer) was obtained. In the obtained circularly polarizing plate, the angle formed between the polarizing transmission axis of the linear polarizer and the slow axis of the ½ wave plate was 15°, and the angle formed between the polarizing transmission axis of the linear polarizer and the slow axis of the ¼ wave plate was 75°.

The obtained circularly polarizing plate was measured for the reflectivity $R_0$ at an incident angle of 0°, the reflectivity $R_{10(0\ deg)}$ at an incident angle of 10° at an azimuth angle of 0°, and the reflectivity $R_{10(180\ deg)}$ at an incident angle of 10° at an azimuth angle of 180° in the following manner.

The circularly polarizing plate was cut to obtain a piece having an appropriate size. The surface of the barrier layer of the circularly polarizing plate was bonded to the reflective surface of a reflector (trade name "Metalumy TS50" manufactured by Toray Industries, Inc., aluminum metalized PET (polyethylene terephthalate) film). The bonding was performed via a tackiness agent layer (trade name "CS9621" manufactured by Nitto Denko Corporation). Accordingly, a layered body for evaluation having a layer structure of (circularly polarizing plate)/(tackiness agent layer)/(reflector) was obtained. The obtained layered body for evaluation was measured for the reflectivity of light having entered the circularly polarizing plate. For the measurement, V7200 spectrophotometer and VAP7020 absolute reflectivity unit (manufactured by Jasco Corporation) were used. In the measurement, the reference of the azimuth angle was the direction of the polarizing absorption axis of the linear polarizer when the layered body for evaluation was observed from the circularly polarizing plate, and the reflectivity at an incident angle of 0° at an azimuth angle of 0° and the reflectivity at an incident angle of 10° at an azimuth angle of 180° were measured. The results are shown in Table 1.

1-5. Organic Electroluminescent Display Device

A commercially available OLED smartphone (trade name "G Flex LGL23" manufactured by LG Electronics Incorporated) was disassembled, and the circularly polarizing plate obtained in (1-4) was mounted to obtain an organic electroluminescent display device including the circularly polarizing plate. This display device was measured for luminance while displaying black image and while displaying white image, and the results were 5.1 $cd/m^2$ and 300 $cd/m^2$, respectively.

When the display surface was visually observed from the front direction while displaying black image under outside light on a sunny day, there was no reflection of outside light on the display surface, and the display surface was in black color. Furthermore, when the display surface was visually observed from oblique directions (polar angle: 45°, all azimuths), the reflectivity and color did not change depending on the azimuth angles.

Example 2

2-1. Phase Difference Film

The ¼ wave plate A2 obtained in Production Example 4 was unwound from the roll, and used as the ¼ wave plate. The ½ wave plate B1 obtained in Production Example 5 was unwound from the roll, and used as the ½ wave plate. These were bonded together via an adhesive layer ("CS9621" manufactured by Nitto Denko Corporation) in such a manner that their lengthwise directions are in parallel with each other. In this bonding, the front and back relationship of these plates A2 and B1 was in such a direction that the angle formed between the slow axis of the ¼ wave plate and the slow axis of the ½ wave plate becomes 60° when viewed from the thickness direction. Thus, a phase difference film (II-1) was obtained.

2-2. Production And Evaluation of Multilayer Film

A barrier layer made of SiOx having a thickness of 300 nm was formed, and a multilayer film (II-2) having a layer structure of (½ wave plate)/(tackiness agent layer)/(¼ wave plate)/(barrier layer) was obtained and evaluated in the same manner as that of (1-2) to (1-3) of Example 1 except that the phase difference film (II-1) was used in place of the phase difference film (I-1).

2-3. Production And Evaluation of Circularly Polarizing Plate

As the linear polarizer, a polarizing film was prepared.
This polarizing film was bonded to the multilayer film (II-2) via a layer of a tackiness agent ("CS9621" manufactured by Nitto Denko Corporation) in such a manner that their lengthwise directions are in parallel. The bonded product was cut to obtain an A4-size rectangular piece having its polarizing transmission axis in the direction of 0° relative to the short side direction. Accordingly, a circularly polarizing plate having a layer structure of (linear polarizer)/(tackiness agent layer)/(½ wave plate)/(tackiness agent layer)/(¼ wave plate)/(barrier layer) was obtained. In the obtained circularly polarizing plate, the angle formed between the polarizing transmission axis of the linear polarizer and the slow axis of the ½ wave plate was 15°, and the angle formed between the polarizing transmission axis of the linear polarizer and the slow axis of the ¼ wave plate was 75°.

The obtained circularly polarizing plate was measured for the reflectivity $R_0$ at an incident angle of 0°, the reflectivity $R_{10(0\ deg)}$ at an incident angle of 10° at an azimuth angle of 0°, and the reflectivity $R_{10(180\ deg)}$ at an incident angle of 10° at an azimuth angle of 180° in the same manner as that of Example 1. The results are shown in Table 1.

Example 3

3-1. Production And Evaluation of Multilayer Film

A barrier layer made of SiOx having a thickness of 300 nm was formed, and a multilayer film (III-2) having a layer structure of (¼ wave plate)/(barrier layer) was obtained and evaluated in the same manner as that of (1-2) to (1-3) of Example 1 except that the ¼ wave plate A1 produced in Production Example 3 as it was was used in place of the phase difference film (I-1).

3-2. Production And Evaluation of Circularly Polarizing Plate

As the linear polarizer, a polarizing film was prepared.
This polarizing film was bonded to the multilayer film (III-2) via a layer of a tackiness agent ("CS9621" manufactured by Nitto Denko Corporation) in such a manner that their lengthwise directions are in parallel with each other. The bonded product was cut to obtain an A4-size rectangular piece having its polarizing transmission axis in the direction of 0° relative to the short side direction. Accordingly, a circularly polarizing plate having a layer structure of (linear polarizer)/(tackiness agent layer)/(¼ wave plate)/(barrier layer) was obtained. In the obtained circularly polarizing plate, the angle formed between the polarizing transmission axis of the linear polarizer and the slow axis of the ¼ wave plate was 45°.

The obtained circularly polarizing plate was measured for the reflectivity $R_0$ at an incident angle of 0°, the reflectivity $R_{10(0\ deg)}$ at an incident angle of 10° at an azimuth angle of 0°, and the reflectivity $R_{10(180\ deg)}$ at an incident angle of 10° at an azimuth angle of 180° in the same manner as that of Example 1. The results are shown in Table 1.

Example 4

4-1. Production And Evaluation of Multilayer Film

A multilayer film (IV-2) having a layer structure of (½ wave plate)/(tackiness agent layer)/(¼ wave plate)/(barrier layer) and a circularly polarizing plate having a layer structure of (linear polarizer)/(tackiness agent layer)/(½ wave plate)/(tackiness agent layer)/(¼ wave plate)/(barrier layer) were obtained and evaluated in the same manner as that of Example 2, except that the ¼ wave plate A3 produced in Production Example 10 was used in place of the ¼ wave plate A2 produced in Production Example 4. The results are shown in Table 1.

Comparative Example 1

C1-1. Phase Difference Film

The ¼ wave plate B2 produced in Production Example 6 was unwound from the roll, and used as the ¼ wave plate. The ½ wave plate B3 obtained in Production Example 7 was unwound from the roll, and used as the ½ wave plate. These were bonded together via an adhesive layer ("CS9621" manufactured by Nitto Denko Corporation) in such a manner that their lengthwise directions are in parallel with each other. In this bonding, the front and back relationship of these plates B2 and B3 was in such a direction that the angle formed between the slow axis of the ¼ wave plate and the slow axis of the ½ wave plate becomes 60° when viewed from the thickness direction. Thus, a phase difference film (CI-1) was obtained.

C1-2. Production And Evaluation of Multilayer Film

A barrier layer made of SiOx having a thickness of 300 nm was formed, and a multilayer film (CI-2) having a layer structure of (½ wave plate)/(tackiness agent layer)/(¼ wave plate)/(barrier layer) was obtained and evaluated in the same manner as that of (1-2) to (1-3) of Example 1 except that the phase difference film (CI-1) was used in place of the phase difference film (I-1).

C1-3. Production And Evaluation of Circularly Polarizing Plate

As the linear polarizer, a polarizing film was prepared.
This polarizing film was bonded to the multilayer film (CI-2) via a layer of a tackiness agent ("CS9621" manufactured by Nitto Denko Corporation) in such a manner that their lengthwise directions are in parallel with each other. The bonded product was cut to obtain an A4-size rectangular piece having its polarizing transmission axis in the direction of 0° relative to the short side direction. Accordingly, a circularly polarizing plate having a layer structure of (linear polarizer)/(tackiness agent layer)/(½ wave plate)/(tackiness agent layer)/(¼ wave plate)/(barrier layer) was obtained. In the obtained circularly polarizing plate, the angle formed between the polarizing transmission axis of the linear polarizer and the slow axis of the ½ wave plate was 75°, and the angle formed between the polarizing transmission axis of the linear polarizer and the slow axis of the ¼ wave plate was 15°.

The obtained circularly polarizing plate was measured for the reflectivity $R_0$ at an incident angle of 0°, the reflectivity $R_{10\ deg}$ at an incident angle of 10° at an azimuth angle of 0°, and the reflectivity $R_{10(180\ deg)}$ at an incident angle of 10° at an azimuth angle of 180° in the same manner as that of Example 1. The results are shown in Table 2.

Comparative Example 2

C2-1. Production And Evaluation of Multilayer Film

A barrier layer made of SiOx having a thickness of 300 nm was formed, and a multilayer film (CII-2) having a layer structure of (¼ wave plate)/(barrier layer) was obtained and evaluated in the same manner as that of (1-2) to (1-3) of Example 1 except that the ¼ wave plate B4 produced in Production Example 8 as it was was used in place of the phase difference film (I-1).

C2-2. Production And Evaluation of Circularly Polarizing Plate

As the linear polarizer, a polarizing film was prepared.
This polarizing film was bonded to the multilayer film (CII-2) via a layer of a tackiness agent ("CS9621" manufactured by Nitto Denko Corporation) in such a manner that their lengthwise directions are in parallel with each other. The bonded product was cut to obtain an A4-size rectangular piece having its polarizing transmission axis in the direction of 0° relative to the short side direction. Accordingly, a circularly polarizing plate having a layer structure of (linear polarizer)/(tackiness agent layer)/(¼ wave plate)/(barrier layer) was obtained. In the obtained circularly polarizing plate, the angle formed between the polarizing transmission axis of the linear polarizer and the slow axis of the ¼ wave plate was 45°.

The obtained circularly polarizing plate was measured for the reflectivity $R_0$ at an incident angle of 0°, the reflectivity $R_{10(0\ deg)}$ at an incident angle of 10° at an azimuth angle of 0°, and the reflectivity $R_{10(180\ deg)}$ at an incident angle of 10° at an azimuth angle of 180° in the same manner as that of Example 1. The results are shown in Table 2.

The results in Examples and Comparative Examples are shown in Table 1 and Table 2.

TABLE 1

|  | Ex. 1 Double type | Ex. 2 Double type | Ex. 3 Single type |
|---|---|---|---|
| ¼ wave plate | A1 | A2 | A1 |
| Re (nm) | 136 | 141 | 136 |
| Thickness dq (μm) | 35 | 30 | 35 |
| Melting point (° C.) | 262 | 262 | 262 |
| Tg (° C.) | 93 | 93 | 93 |
| Photoelastic coefficient Pa$^{-1}$ | $4 \times 10^{-12}$ | $4 \times 10^{-12}$ | $4 \times 10^{-12}$ |
| Thermal size change ratio (%) | 0.4 | 0.3 | 0.4 |
| Birefringence Δn | 0.0039 | 0.0047 | 0.0039 |
| Stretching | Oblique | Oblique | Oblique |
| Orientation angle (°) | 135 | 15 | 45 |
| ½ wave plate | B1 | B1 | — |
| Re (nm) | 260 | 260 | — |
| Thickness dh (μm) | 50 | 50 | — |
| Melting point (° C.) | — | — | — |
| Tg (° C.) | 126 | 126 | — |
| Photoelastic coefficient Pa$^{-1}$ | $6 \times 10^{-12}$ | $6 \times 10^{-12}$ | — |
| Thermal size change ratio (%) | Wrinkles on the entire surface | Wrinkles on the entire surface | — |
| Birefringence Δn | 0.0054 | 0.0054 | — |
| Stretching | Oblique –> longitudinal | Oblique –> longitudinal | — |
| Orientation angle (°) | 75 | 75 | — |
| Water vapor permeability (g/(m$^2$ · day)) | Not more than detection limit | Not more than detection limit | Not more than detection limit |
| Surface state | Good | Good | Good |
| Curl amount (mm) | 12 | 18 | 32 |
| Adhesion | 100/100 | 100/100 | 100/100 |
| Incident angle 0° reflectivity $R_0$ | 4.68 | 4.23 | 4.55 |
| Azimuth angle 0°: incident angle 10° reflectivity $R_{10}$ (0 deg) | 4.67 | 4.21 | 5.21 |
| Azimuth angle 180°: incident angle 10° reflectivity $R_{10}$ (180 deg) | 4.67 | 4.22 | 5.34 |

TABLE 2

|  | Ex. 4 Double type | Comp. Ex. 1 Double type | Comp. Ex. 2 Single type |
|---|---|---|---|
| ¼ wave plate | A3 | B2 | B4 |
| Re (nm) | 145 | 130 | 140 |
| Thickness dq (μm) | 13 | 40 | 47 |
| Melting point (° C.) | 262 | — | — |
| Tg (° C.) | 93 | 126 | 126 |
| Photoelastic coefficient Pa$^{-1}$ | $4 \times 10^{-12}$ | $6 \times 10^{-12}$ | $6 \times 10^{-12}$ |
| Thermal size change ratio (%) | 0.6 | Wrinkles on the entire surface | Wrinkles on the entire surface |
| Birefringence Δn | 0.011 | 0.0032 | 0.0030 |
| Stretching | Oblique | Oblique –> longitudinal | Oblique |
| Orientation angle (°) | 15 | 75 | 45 |
| ½ wave plate | B1 | B3 | — |
| Re (nm) | 260 | 260 | — |
| Thickness dh (μm) | 50 | 22 | — |
| Melting point (° C.) | — | — | — |
| Tg (° C.) | 126 | 126 | — |
| Photoelastic coefficient Pa$^{-1}$ | $6 \times 10^{-12}$ | $6 \times 10^{-12}$ | — |

TABLE 2-continued

|  | Ex. 4 Double type | Comp. Ex. 1 Double type | Comp. Ex. 2 Single type |
|---|---|---|---|
| Thermal size change ratio (%) | Wrinkles on the entire surface | Wrinkles on the entire surface | — |
| Birefringence Δn | 0.0054 | 0.0118 | — |
| Stretching | Oblique –> longitudinal | Oblique | — |
| Orientation angle (°) | 75 | 15 | — |
| Water vapor permeability (g/(m² · day)) | Not more than detection limit | Not more than detection limit | Not more than detection limit |
| Surface state | Good | Failure | Failure |
| Curl amount (mm) | 20 | Failure | Failure |
| Adhesion | 100/100 | 30/100 | 54/100 |
| Incident angle 0° reflectivity $R_0$ | 4.32 | 6.84 | 7.47 |
| Azimuth angle 0°: incident angle 10° reflectivity $R_{10}$ (0 deg) | 5.11 | 8.56 | 9.72 |
| Azimuth angle 180°: incident angle 10° reflectivity $R_{10}$ (180 deg) | 4.89 | 7.44 | 8.45 |

As seen from the results in Table 1 and Table 2, in Examples in which the multilayer films each include the layer of the specific resin A defined in this application in the phase difference film, the water vapor permeability is favorable, the reflectivity $R_0$ at an incident angle of 0° and the reflectivity $R_{10}$ at an incident angle of 10° are both excellent, and the film surface state, curl amount, adhesion, and the like are also excellent. As a result, it is seen that there were obtained multilayer films each of which has high optical quality and can be easily produced.

REFERENCE SIGN LIST

10: organic electroluminescent display device
109: phase difference film
110: multilayer film
100: antireflective film
110: multilayer film
111: adhesive layer
112: ½ wave plate
113: barrier layer
113D: lower side surface of the antireflective film
114: ¼ wave plate
114D: surface of the phase difference film
121: linear polarizer
131: substrate
132: light-emitting element
133: sealing material layer
133U: top surface of the sealing material layer
134: protective film
134U: top surface of the protective film
200: film forming apparatus
201: roll body of the phase difference film
202: roll body of the multilayer film
211: guide roll
212: can roll
213: guide roll
221: reaction tube
223: power supply
222: electrode
224: gas inlet
230: vacuum evacuation device
290: vacuum chamber

The invention claimed is:

1. A multilayer film for an organic electroluminescent display device, the multilayer film comprising: a phase difference film; and a barrier layer directly disposed on a surface of the phase difference film, wherein
the phase difference film includes one or more layers of a resin A as a layer in direct contact with the barrier layer,
the resin A includes a crystallizable polymer A having a melting point of 250° C. or higher, and
the layer of the resin A has an in-plane retardation Re of 108 nm or more and 168 or less measured with light having a wavelength of 590 nm at 23° C., and an absolute value of a photoelastic coefficient of $2.0 \times 10^{-11}$ $Pa^{-1}$ or less.

2. The multilayer film according to claim 1, wherein
the polymer A is an alicyclic structure-containing polymer having a positive intrinsic birefringence value, and
an absolute value of a thermal size change ratio in a plane of a film when the layer of the resin A is heated at 150° C. for 1 hour is 1% or less.

3. The multilayer film according to claim 1, wherein the layer of the resin A has a birefringence Δn of 0.0010 or more.

4. The multilayer film according to claim 1, wherein
the multilayer film has a long-length shape,
the phase difference film includes a ¼ wave plate as the layer of the resin A,
the phase difference film further includes a ½ wave plate,
a slow axis of the ½ wave plate and a slow axis of the ¼ wave plate are each in an oblique direction relative to a long-length direction of the multilayer film, and
an angle of intersection between the slow axis of the ½ wave plate and the slow axis of the ¼ wave plate is 55° or larger and 65° or smaller.

5. The multilayer film according to claim 4, wherein a thickness dh of the ½ wave plate and a thickness dq of the ¼ wave plate are each 10 μm or more and 50 μm or less and satisfy a relation of dh≥dq.

6. The multilayer film according to claim 4, wherein the ½ wave plate and the ¼ wave plate are each a stretched film having been subjected to oblique stretching one or more times.

7. A method for producing the multilayer film according to claim 4, comprising
a step of bonding the ½ wave plate and the ¼ wave plate via an adhesive to form a phase difference film including these wave plates; and
a step of forming the barrier layer directly on a surface of the phase difference film on a side of the ¼ wave plate.

8. The multilayer film according to claim 1, having a water vapor permeability of 0.01 g/(m²·day) or lower.

9. The multilayer film according to claim 1, wherein the barrier layer includes one or more inorganic barrier layers.

10. A circularly polarizing plate comprising:
the multilayer film according to claim 1; and
a linear polarizer disposed on a surface of the multilayer film opposite to the barrier layer.

11. An antireflective film comprising the circularly polarizing plate according to claim 10, wherein
the antireflective film includes the linear polarizer, a ½ wave plate, a ¼ wave plate as the layer of the resin A, and the barrier layer in this order,
an angle formed between a polarizing transmission axis of the linear polarizer and a slow axis of the ½ wave plate is 10° or more and 20° or less, or 70° or more and 80° or less, and a ratio $R_0/R_{10(0\ deg)}$ of a reflectivity $R_0$ at an incident angle of 0° relative to a reflectivity $R_{10(0\ deg)}$ at an incident angle of 10° at an azimuth angle of 0°, and a ratio $R_0/R_{10(180\ deg)}$ of the reflectivity $R_0$ at the incident angle of 0° relative to a reflectivity $R_{10(180\ deg)}$ at an incident angle of 10° at an azimuth angle of 180° are both 0.95 or more and 1.05 or less.

12. An organic electroluminescent display device comprising the antireflective film according to claim 11.

* * * * *